United States Patent [19]
Maeda et al.

[11] Patent Number: 5,853,528
[45] Date of Patent: Dec. 29, 1998

[54] METHOD FOR MANUFACTURING LAMINATES AND APPARATUS PERFORMING THE METHOD

[75] Inventors: Hiroshi Maeda; Kazushi Kawamura; Takeshi Okamoto, all of Kadoma, Japan

[73] Assignee: Marsushita Electric Works. Ltd., Osaka, Japan

[21] Appl. No.: 819,294

[22] Filed: Mar. 18, 1997

[30] Foreign Application Priority Data

Mar. 21, 1996 [JP] Japan ................................ 8-064666

[51] Int. Cl.⁶ ............................. B30B 7/02; B32B 31/20
[52] U.S. Cl. ...................... 156/474; 156/494; 156/563; 156/583.1; 156/226; 156/227; 156/229; 156/273.9; 156/288
[58] Field of Search ................................. 156/160, 226, 156/227, 229, 273.9, 443, 494, 459, 474, 477.1, 288, 563, 583.1

[56] References Cited

U.S. PATENT DOCUMENTS

| | | |
|---|---|---|
| 3,325,334 | 6/1967 | Burnet et al. . |
| 4,268,561 | 5/1981 | Thompson et al. . |
| 5,228,944 | 7/1993 | Seifried et al. . |
| 5,395,465 | 3/1995 | Miura . |
| 5,615,470 | 4/1997 | Ceraso . |

*Primary Examiner*—Michael W. Ball
*Assistant Examiner*—Sam Chuan Yao
*Attorney, Agent, or Firm*—Lynn & Lynn

[57] ABSTRACT

A method and apparatus for manufacturing laminates are arranged for forming a laminate block by sequentially folding back continuous metal sheets 3 and 4 drawn through outlets 16 out of rolls 5 and 6 of the sheets wound on reels 1 and 2, with synthetic resin sheet members 9 and interlayers 10 alternately interposed between the metal sheets, into multiple stages, and pressing the thus stacked laminate block while electrically heating the continuous metal sheets 3 and 4 in the laminate block, wherein the stacking is performed while keeping the continuous metal sheets 3 and 4 in tension between the outlets 16 of the reels 1 and 2 and each end edge of the laminate block 12.

15 Claims, 37 Drawing Sheets

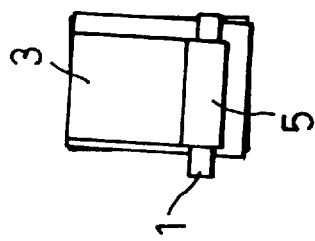
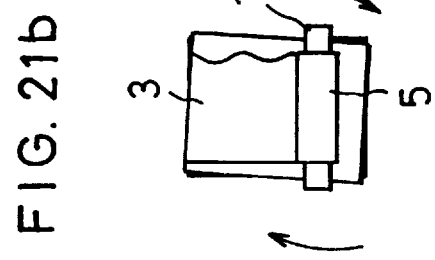
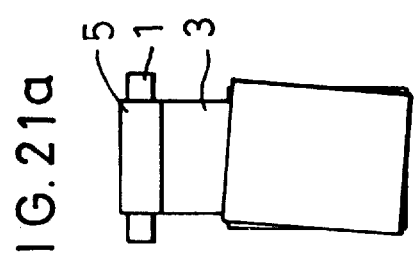
FIG. 21a  FIG. 21b  FIG. 21c
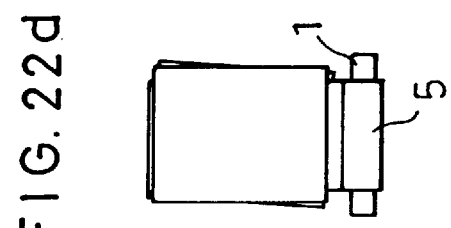
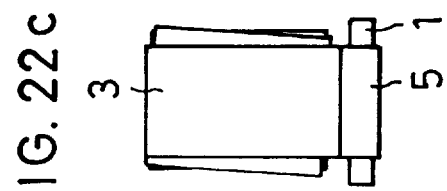
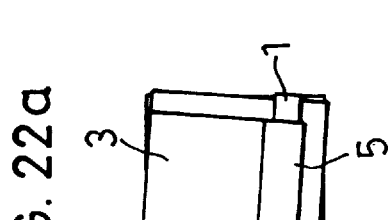
FIG. 22a  FIG. 22b  FIG. 22c  FIG. 22d

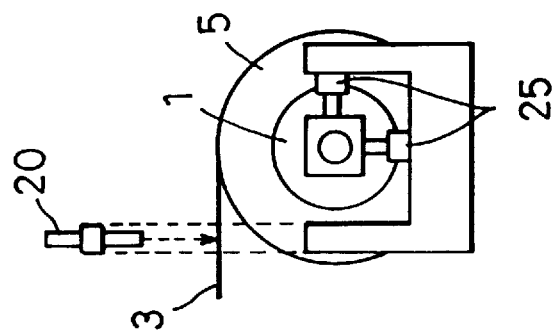
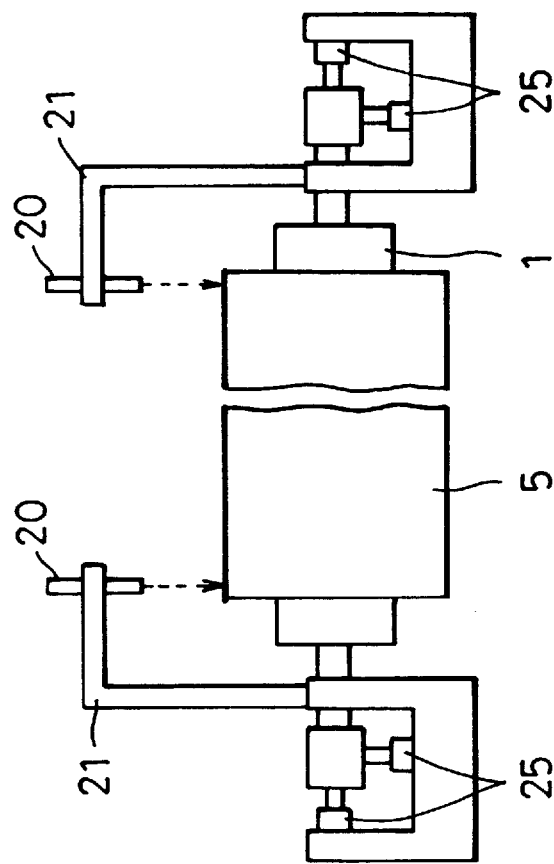

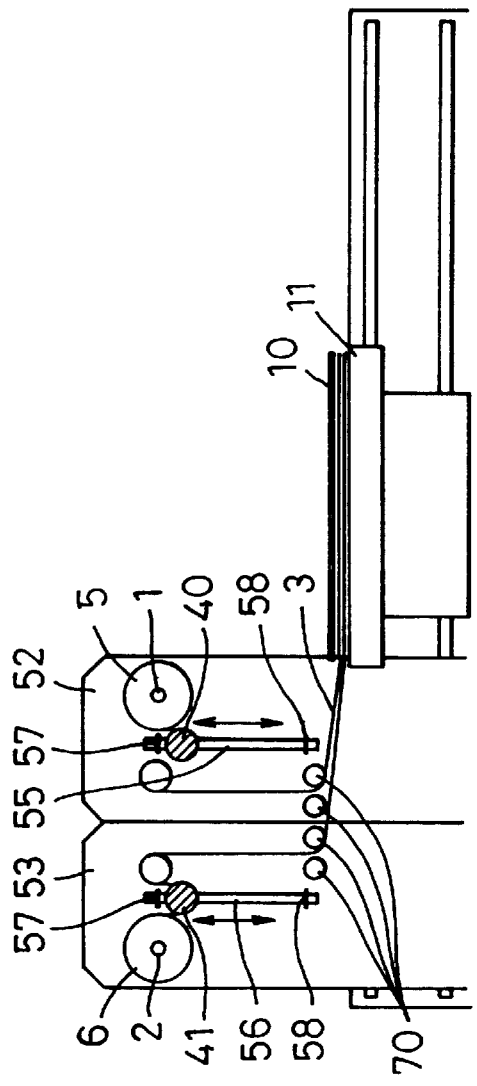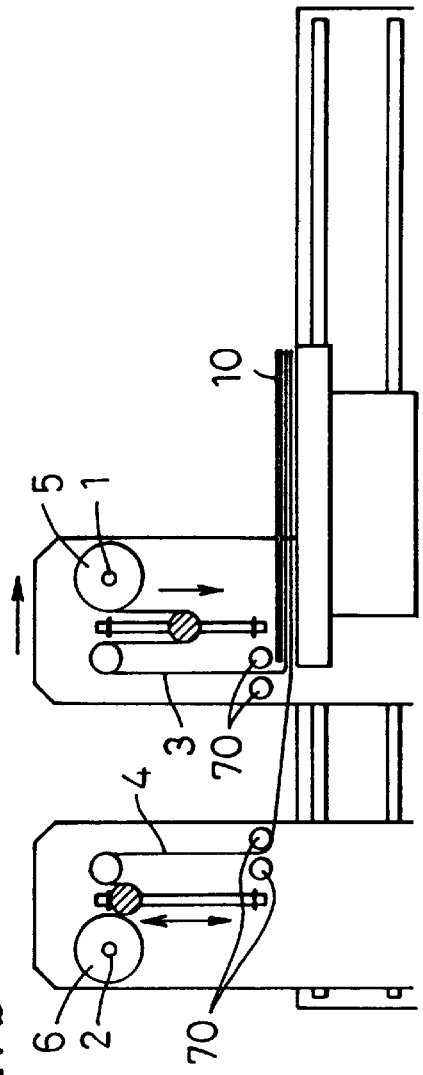

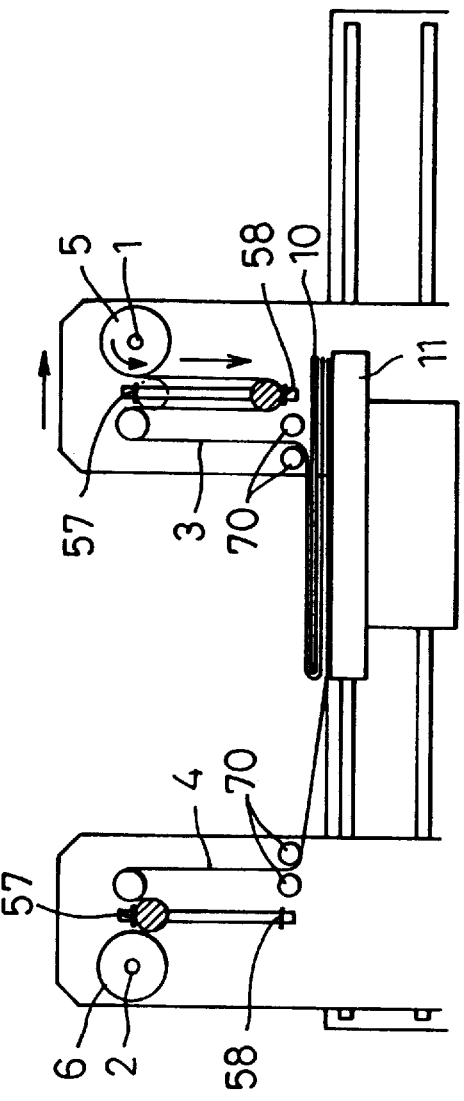
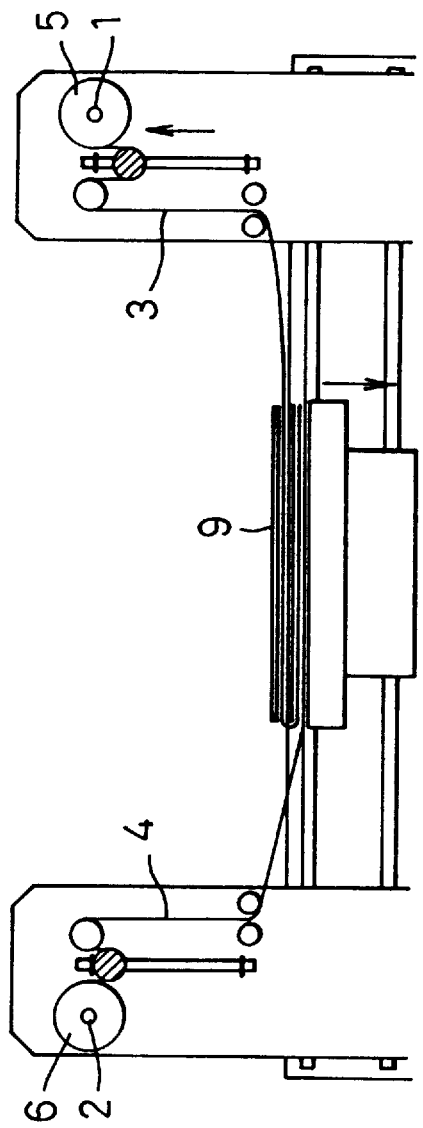
FIG. 28a
FIG. 28b

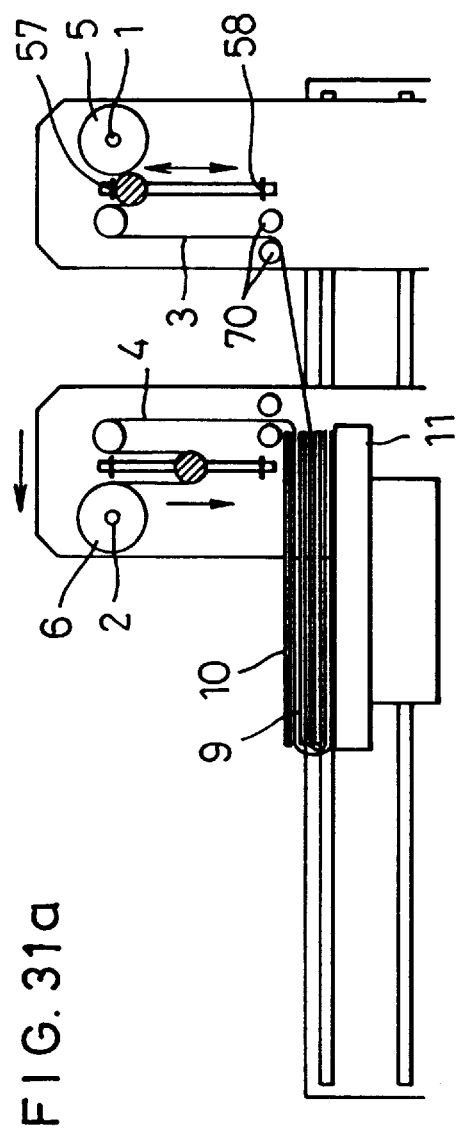
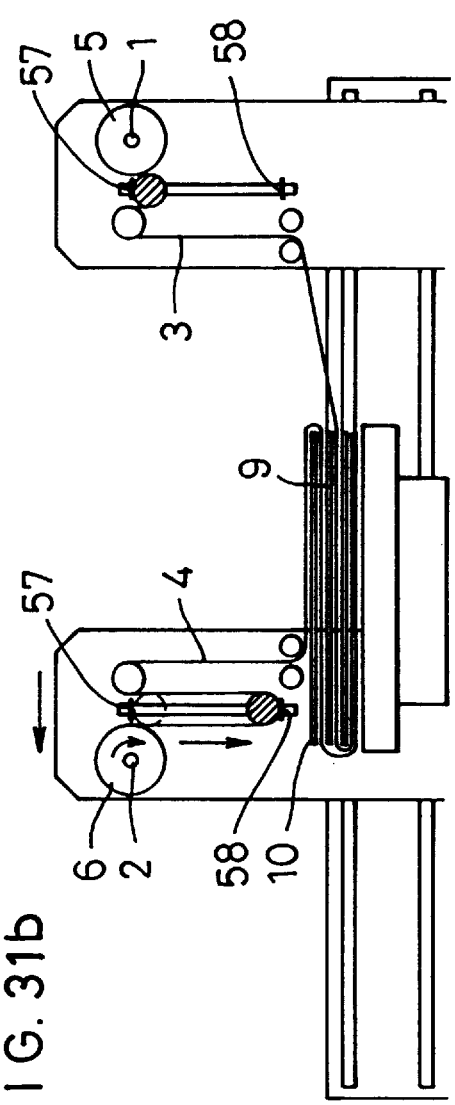
FIG. 31a
FIG. 31b

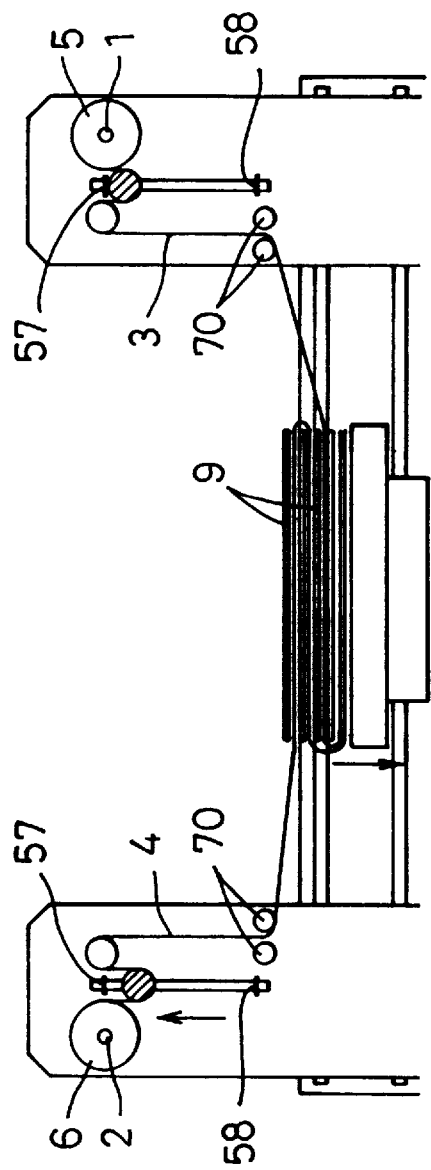
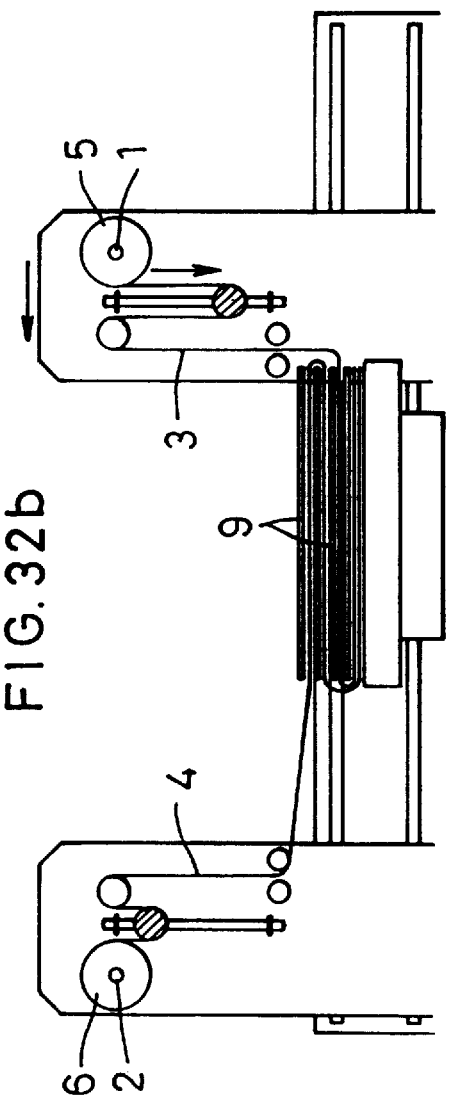
FIG. 32a
FIG. 32b

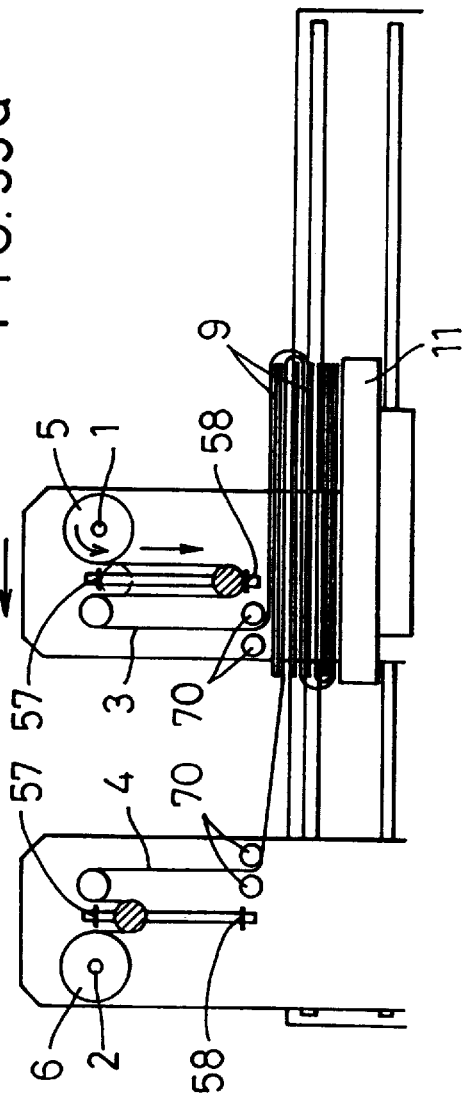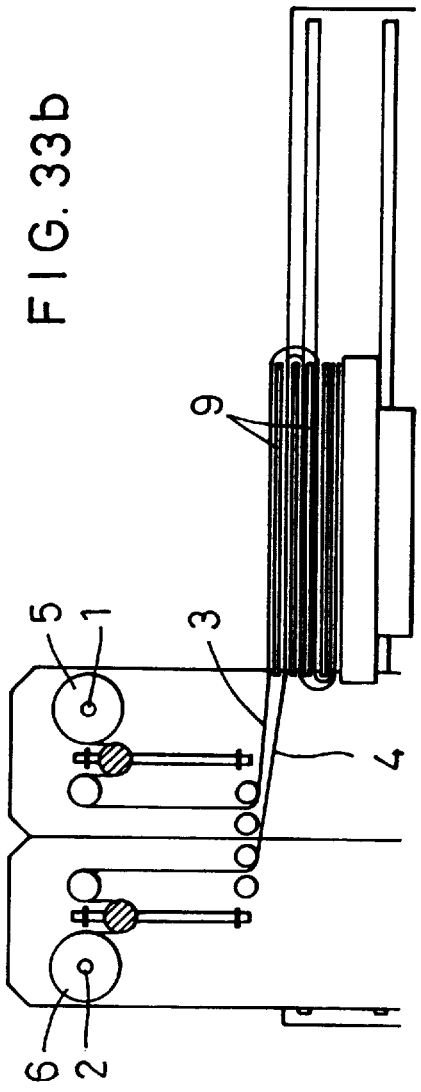

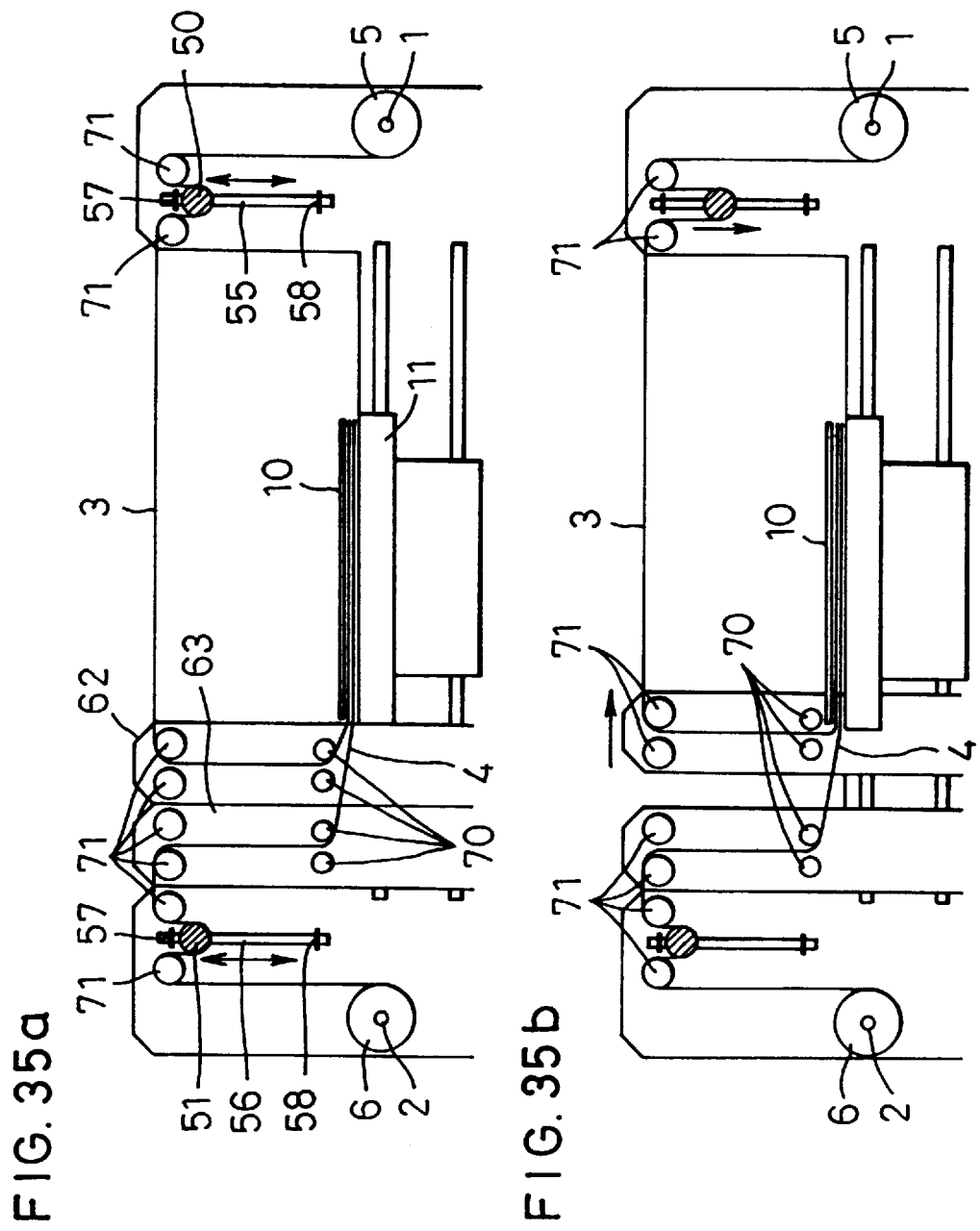

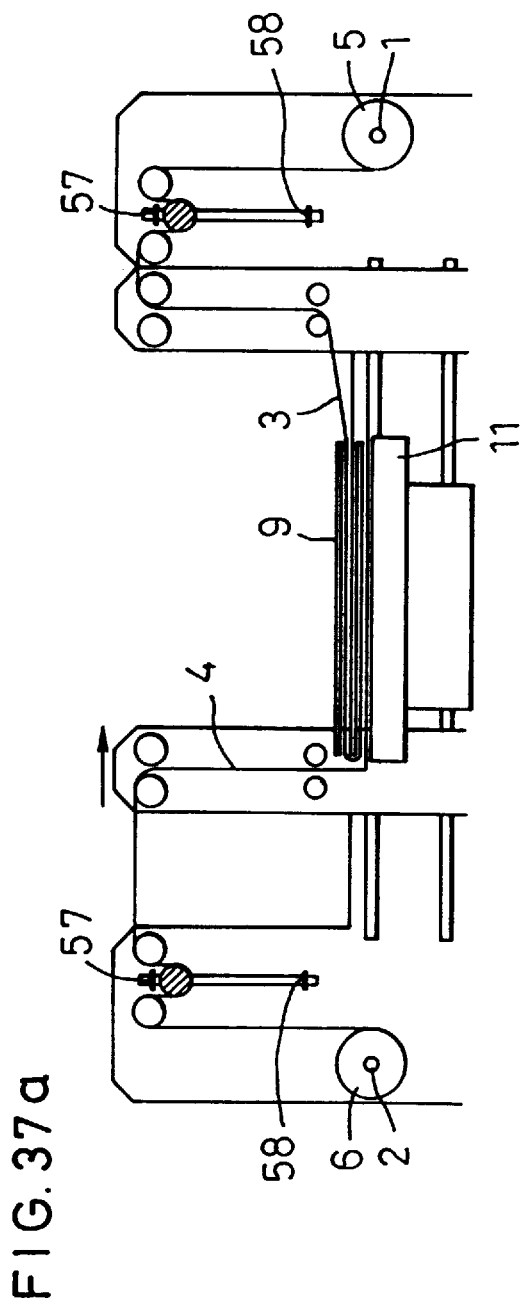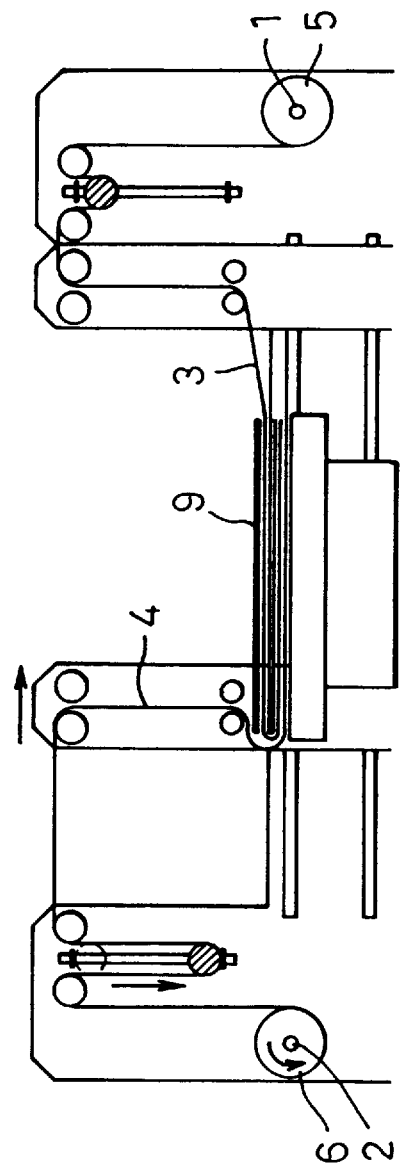
FIG.37a
FIG.37b

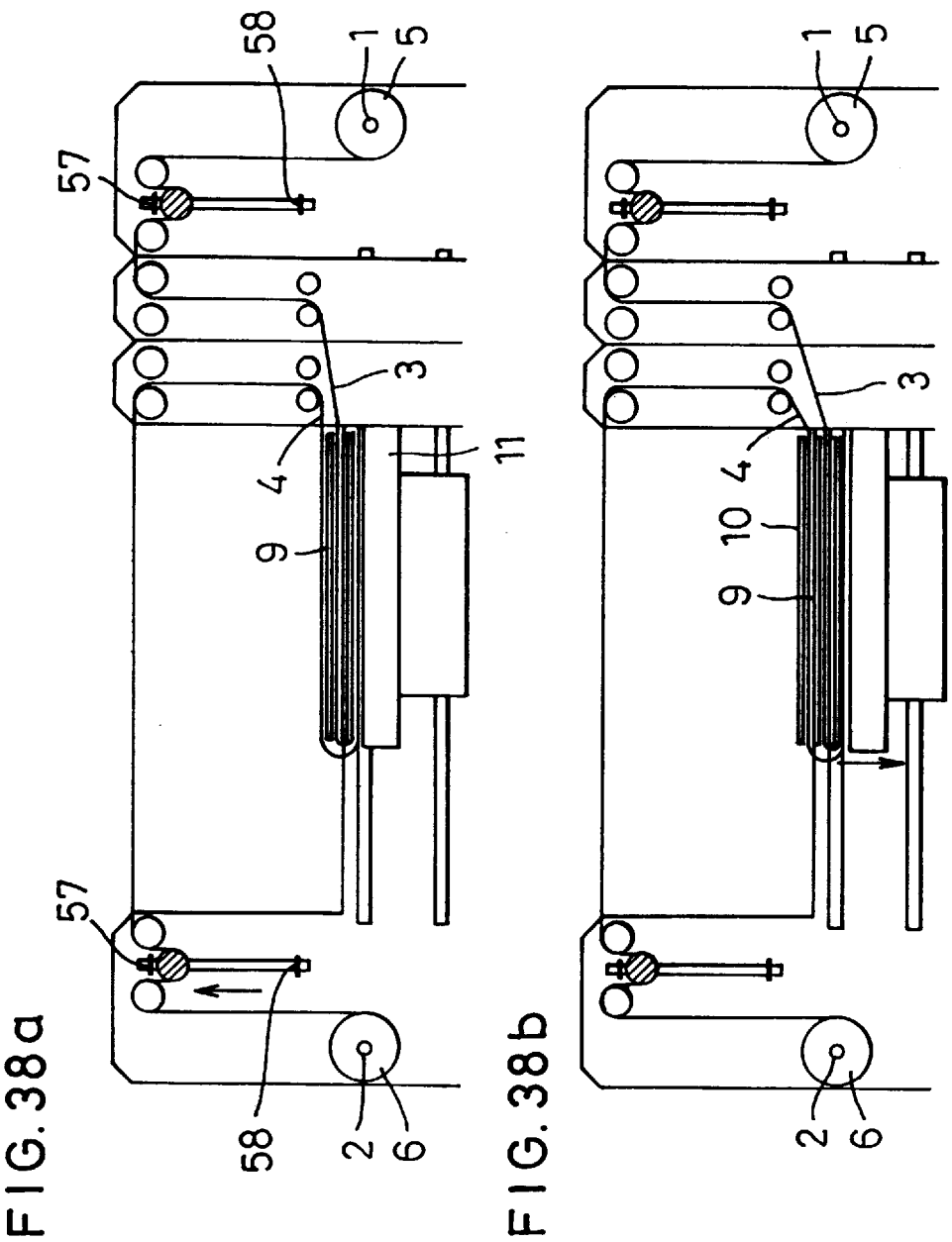

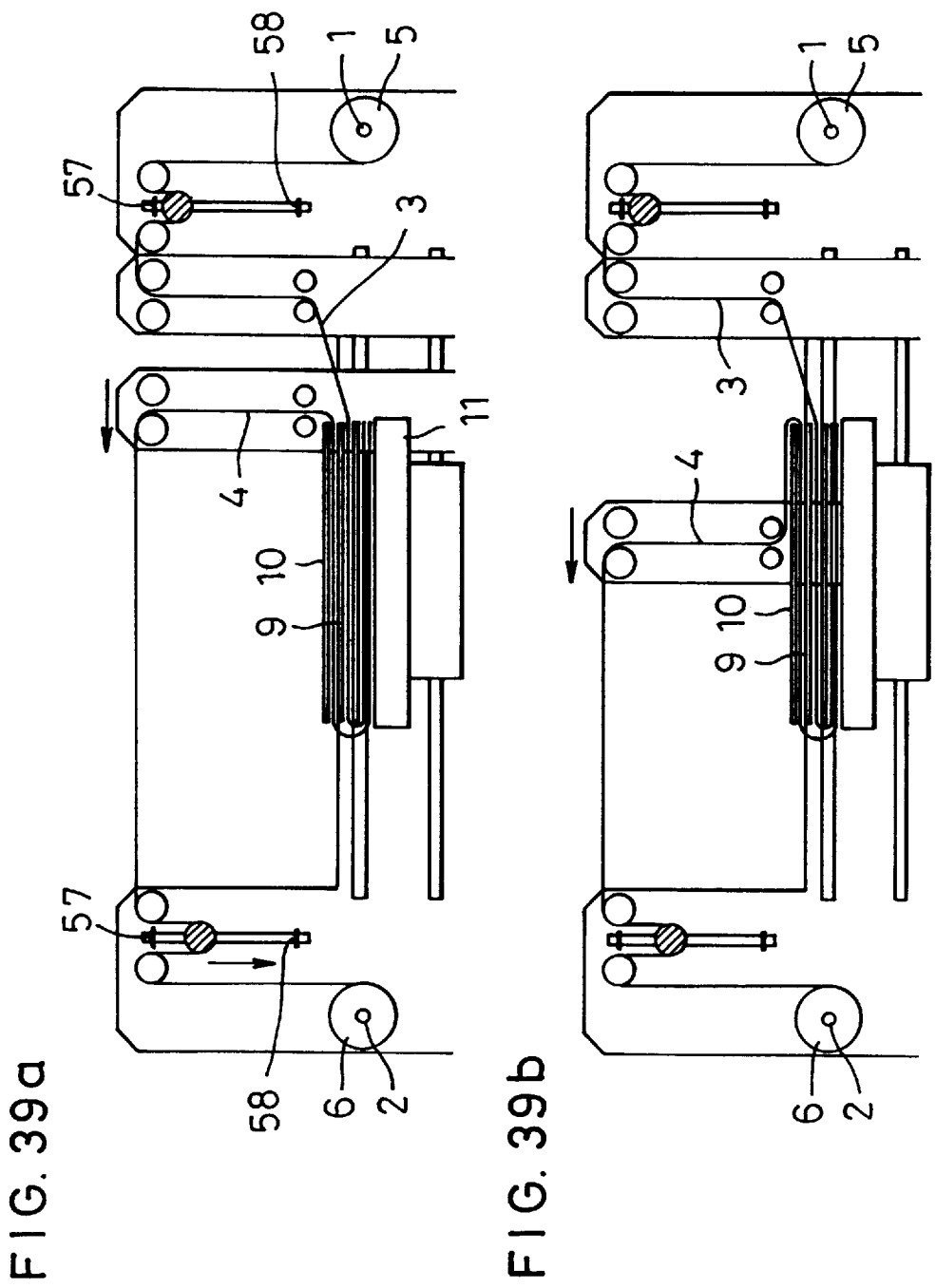

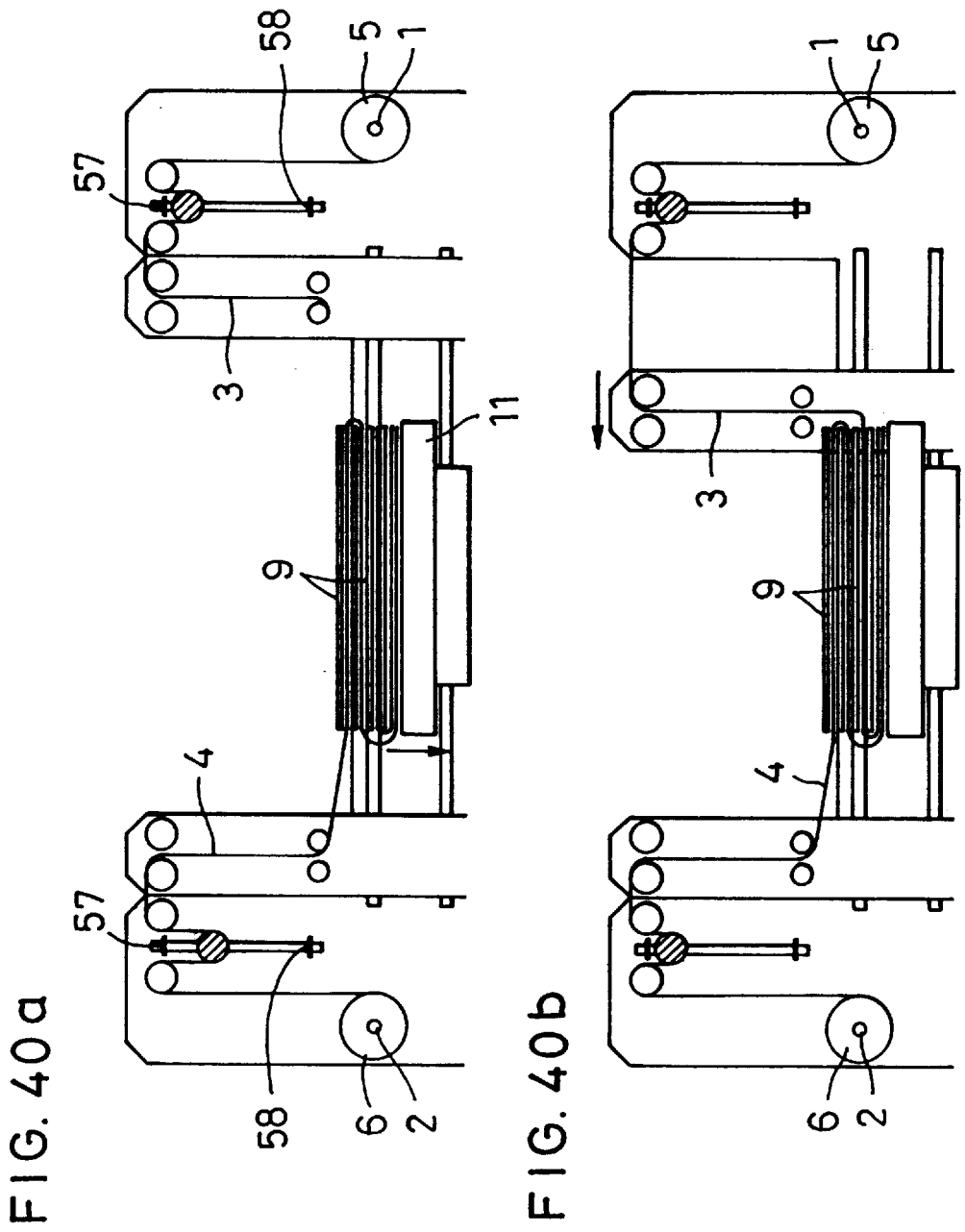

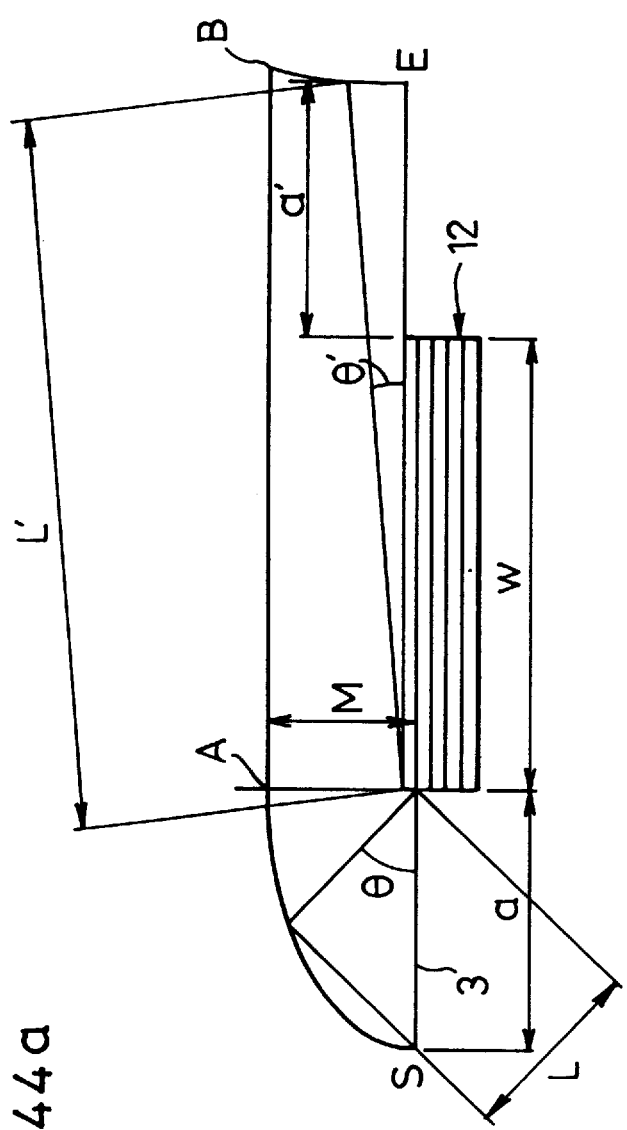
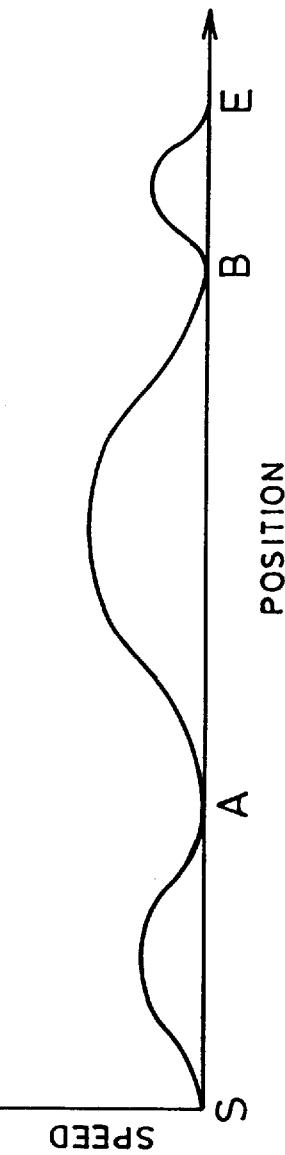
FIG. 44a
FIG. 44b

METHOD FOR MANUFACTURING LAMINATES AND APPARATUS PERFORMING THE METHOD

BACKGROUND OF THE INVENTION

This invention relates to a method for manufacturing laminates and an apparatus for performing the method and, more particularly, a laminate manufacturing method in which synthetic resin sheet members and metal sheets are stacked and are integrally thermoformed under a pressure into laminates including the metal sheets while electrically heating the metal sheets, as well as to an apparatus for performing such method.

DESCRIPTION OF RELATED ART

The laminates having the metal sheets on their surfaces have been obtained through an integral laminate molding of the metal sheets and synthetic resin sheet members. Copper foils or the like have been used as the metal sheet, and the laminate employing prepregs or the like as the synthetic resin sheet member has been employed in various ways such as printed circuit boards and the like. Such laminate is formed by stacking a set of the metal sheets and prepregs, of the metal sheets and inner layer members, or of the metal sheets and inner and outer layer members, melting synthetic resin which forming the prepregs by heating them under a pressure, and causing the resin to set through a heating or cooling. In heating under the pressure the laminated sheets and members, there may be employed such processes as a hot pressing, vacuum pressing and the like.

In the hot pressing process, an opposing pair of heating plates are heated, and the stacked metal sheets and such members as the prepregs and so on are pressurized by the heating plates from both of top and bottom sides. In the vacuum pressing process, on the other hand, the stacked sheets and members are covered hermetically by a packing member, its interior is drawn into a vacuum, and a highly heated and pressurized gas is led to its periphery. When the laminate molding is performed through such hot pressing or vacuum pressing process, generally one set of a plurality of such members as the prepregs which forming each laminate is made to form a laminate combination, a plurality of sets of such laminate combinations are stacked with interlayers interposed between them to form a laminate block, and this laminate block is thermoformed under a pressure so that a plurality of the laminates can be simultaneously obtained. The interlayers are employed for ensuring the flatness of the respective laminates produced, and normally stainless steel plates are employed as the interlayers.

In an event where the laminate combinations stacked into multiple layers are subjected to the thermoforming under a pressure through the hot pressing process as has been described, the laminate block is heated from the top and bottom sides by means of press plates of molding press. Therefore, there arises a difference in heated temperature between the laminate combinations facing the press plates and the laminate combination centrally positioned, due to a delay in heat transfer as well as heat radiation from side faces of the laminate block. Such non-uniformity of the heating temperature has resulted in a problem that the thus obtained products of the laminates involve a fluctuation in the quality, due to which an allowable stacking number of the sets of the laminate combinations is limited.

According to the vacuum pressing process, on the other hand, the laminate block is heated from its periphery so that the temperature of the respective laminate combinations in the block will rise substantially uniformly, whereas the temperature difference is still caused to arise due to the delay in the heat transfer between outer peripheral portions and core portion of the respective combinations. For this reason, the molding of the laminate having a larger surface area has been uneasy.

As one of measures for eliminating such problems, there has been a method in which the metal sheet is formed in a continuous sheet, the synthetic resin sheet members and insulating interlayers are alternately stacked with the continuous metal sheet interposed between them as sequentially folded back, so as to be multiple layers, the continuous metal sheet is connected at its both ends to an electric power source so as to function as an electric resistor which generates a required heat so that, when a proper pressure is applied to this laminate block by means of a cold pressing, the respective constituent members are adhered to each other, and a number of the laminates are simultaneously molded. According to such heating process, the heating temperature will be uniform both in stacking direction and planar direction of the constituent members of the laminate, and the quality is caused to less fluctuates. In the case when such manufacturing method is employed, it is necessary to form such laminate block as has been described.

In forming this laminate block, there has been adopted an arrangement in which a pair of continuous metal sheet rolls are constituted with a pair of the continuous metal sheets wound respectively on each of a pair of reels, the pair of continuous metal sheets are drawn out the reels through their outlets, and the laminate block is formed while moving the pair of continuous metal sheet rolls above the laminate block.

In forming such laminate block as has been described, however, there has been a problem that the pair of continuous metal sheets are caused to be excessively drawn out so that, when the pair of continuous metal sheets employed are thin, they may happen to be wrinkled as a result of being expanded or to be doubled. Further, when an excessive tensile force is applied to the continuous metal sheets and especially upon application of a tensile force non-uniform in axial direction of the pair of reels, there arises a problem that the pair of continuous metal sheets may happen to be torn off by edges or the like of the interlayers.

Since at this time the pair of continuous metal sheets are excessively drawn, an operator will have to wind up or draw out a required amount of the pair of continuous metal sheets, so that there arises a problem that the operation is time-consuming, and the production cannot be speeded up.

Arrangements of the kind as above for manufacturing the laminates have been disclosed, for example, in Japanese Patent Laid-Open Publications Nos. 4-192497 and 7-52354.

SUMMARY OF THE INVENTION

The present invention has been suggested in order to overcome the foregoing problems, and its object is to privide a method for manufacturing the laminates and an apparatus for performing the method, which are capable of restraining any slackening of the continuous metal sheets which can be a cause of the wrinkle, doubling or tear of the sheets during the formation of the laminate block, capable of shortening operation time to speed up the production, and capable of elevating production efficiency with the operation rendered to be easier for its automation.

The above object can be realized by means of a method for manufacturing the laminates in which continuous thin metal sheets 3 and 4 wound as rolls 5 and 6 on reels are sequentially folded back while alternately interposing synthetic resin sheet members 9 and insulating interlayers 10 to stack them into a laminate block 12 of multiple layers, and the laminate block 12 is thermoformed under a pressure while electrically heating the metal sheets 3 and 4 in the block 12, characterized in that the continuous thin metal sheets 3 and 4 are folded back while keeping the sheets in tension between outlets 16 of the reels and an end edge of the stacked block 12.

With such manufacturing method, it is enabled to prevent any slackening of the continuous metal sheets 3 and 4, which being a cause of wrinkle, doubling or tear of the sheets even when the continuous metal sheets employed are thin, by keeping the continuous metal sheets 3 and 4 in tension while forming the laminate block 12.

In this method for manufacturing the laminates, it is desirable that stacking work of the laminate block 12 while a pair of the continuous metal sheet rolls 5 and 6 consisting of a pair of the continuous metal sheets 3 and 4 and a pair of reels 1 and 2 are repeatedly transferred from one end edge to the other end edge of the laminate block 12, with the pair of the continuous metal sheets 3 and 4 drawn out as kept in tension, so that the pair of the continuous metal sheets 3 and 4 can be easily prevented from being slackened, by setting the locus of respective outlets 16 of the reels 1 and 2 so as to be able to keep both continuous metal sheets 3 and 4 in tension simultaneously with the drawing out of the continuous metal sheets 3 and 4.

It is also desirable that rotating speed of the pair of reels 1 and 2 rotated as the pair of continuous metal sheets 3 and 4 are drawn is controlled, so that any excessive rotation of the reels 1 and 2 as well as excessive drawing of the metal sheets 3 and 4 due to the inertial force of rotation of the reels 1 and 2 as well as the rolls 5 and 6 can be prevented to hinder the slack of the metal sheets 3 and 4 to occur and, at the same time, any tensile force applied as a shock to the metal sheets 3 and 4 also due to the inertial force of rotation of the rolls 5 and 6 can be reduced.

The speed of rotation of the reels 1 and 2 caused as the continuous metal sheets 3 and 4 wound thereon are drawn should desirably be controlled in accordance with a speed of the transfer of the metal sheet rolls 5 and 6, such that, for example, the rotating speed of the reels 1 and 2 will be gradually reduced as the transferring speed of the rolls 5 and 6 is gradually reduced upon termination of the transfer of the rolls 5 and 6, so that the inertial force of rotation of the reels 1 and 2 can be minimized so as to be able to prevent the continuous metal sheets 3 and 4 from being excessively drawn out of the rolls for preventing thereby the slack and resultant wrinkle of the metal sheets 3 and 4, and also to be able to reduce any shock given to the metal sheets 3 and 4 at the time when the reels 1 and 2 shift from their standstill state to their rotating state for preventing thereby the tear of the metal sheets 3 and 4. Further, the shock given to the metal sheets 3 and 4 can be still reduced by stopping once the transfer of the rolls 5 and 6 in the beginning of their transfer and thereafter starting the transfer of the rolls 5 and 6 with the speed raised at a small acceleration.

The locus of the outlets 16 of the reels 1 and 2 should desirably be set so that the speed of rotation of the reels 1 and 2 upon drawing out of the continuous metal sheets 3 and 4 will be gradually accelerated, whereby the shocking tensile force given to the metal sheets 3 and 4 in the beginning of the transfer of the metal sheet rolls 5 and 6 can be reduced, and the tensile force to the metal sheets 3 and 4 given as influenced by the inertial force of the rolls 5 and 6 can be reduced for preventing the metal sheets 3 and 4 from being torn out.

The locus of the outlets 16 of the reels 1 and 2 should desirably be so set that the rotating speed of the reels 1 and 2 will be gradually lowered when the rotation of the reels caused by the metal sheets 3 and 4 being drawn out stops, so that an inertial rotation of the reels 1 and 2 upon termination of the transfer of the metal sheet rolls 5 and 6 can be minimized by rendering the drawing speed of the metal sheets 3 and 4 to be gradually lowered before termination of the transfer of the rolls 5 and 6, and the slack of the metal sheets 3 and 4 can be restrained.

It is desirable that means for measuring the size of the continuous metal sheet rolls 5 and 6, i.e., the radius or diameter is provided, and the locus of the outlets 16 of the reels 1 and 2 will vary depending on the measured size of the rolls, so that the locus optimum to the size of the rolls can be set on the basis of a measured value of the size of the rolls 5 and 6, and the locus of the outlets 16 of the reels 1 and 2 can be made constant without requiring the operator to set the locus over again with respect to any different size of the rolls even when the size of rolls is varied.

It is desirable that rotating drive of the pair of the reels 1 and 2 is synchronized with the transfer of the pair of the continuous metal sheet rolls 5 and 6, so that a necessary drawing amount of the respective continuous metal sheets 3 and 4 can be presumed from a transfer path of the rolls 5 and 6 (the locus of the outlets 16), and the slack and any excessive tensile force can be prevented from occurring in the metal sheets 3 and 4 when they are drawn, by determining the rotation amount of the respective reels 1 and 2 so as to draw the metal sheets 3 and 4 by an amount slightly smaller than the necessary drawing amount presumed.

It is desirable that means is provided for detecting the position of the pair of the reels 1 and 2 and such roll size as the radius or diameter of the continuous metal sheet rolls 5 and 6 and the rotating amount of the respective reels 1 and 2 is controlled in view of thus detected position and roll size, so that a necessary rotating amount of the respective reels 1 and 2 can be obtained by accurately calculating a necessary drawing amount of the respective metal sheets 3 and 4 from the detected position of the reels 1 and 2 and the detected roll size of the rolls 5 and 6 so as to be able to obtain necessary rotating amount of the respective reels 1 and 2, and the metal sheets 3 and 4 can be drawn only by the necessary amount by rotating the reels 1 and 2 according to the thus obtained necessary rotating amount, for preventing the slack and excessive tensile force from occurring in the metal sheets 3 and 4.

It is desirable to provide means for detecting a slack amount of the pair of the continuous metal sheets 3 and 4 and to control the rotating amount of the pair of the reels 1 and 2 according to the detected slack amount, so that, upon detection of any slack in the metal sheets 3 and 4, the rotating amount of the reels 1 and 2 will be controlled to render the drawing amount of the respective metal sheets 3 and 4 to be more or less reduced, so as to be able to restrain the slack in the respective metal sheets 3 and 4.

It is desirable that the angle and position of the axes of the respective reels 1 and 2 are adjusted so as to distribute the tensile force of the respective continuous metal sheets 3 and 4 uniformly in the axial direction of both reels 1 and 2, so that any one-sided tensile force will be prevented from being applied to the metal sheets 3 and 4, by finely adjusting the angle and position of the axes of the reels 1 and 2 according to the deviation in the tensile force of the metal sheets 3 and 4 for rendering the tensile force applied to the metal sheets 3 and 4 to be uniformly distributed in the axial direction of the reels 1 and 2.

It is desirable that the angle of axes of the reels 1 and 2 is restored to the original when the transfer of the continuous metal sheet rolls 5 and 6 from one end edge to the other end edge of the laminate block 12 terminals, so that the tensile force applied to the metal sheets 3 and 4 when the rolls 5 and 6 have terminated their transfer to be standstill will be less than that during the transfer, any deviation of the respective metal sheets 3 and 4 can be restrained so as not to increase, by placing next one of the interlayers 10 to be parallel at its end face with the axes of the reels 1 and 2, the angle and position of which axes having been restored to the original, and any further deviation of the metal sheets 3 and 4 occurring thereafter can be corrected.

It is desirable that means for detecting applied torque to the axes of the reels 1 and 2 and such roll size as the radius or diameter of the continuous metal sheet rolls 5 and 6 as well as means for causing the axes of the reels 1 and 2 to generate the torque, and the tensile force applied to the continuous metal sheets 3 and 4 is controlled to be constant by calculating the tensile force applied to the metal sheets 3 and 4 in view of the torque and roll size detected and having the torque generated at the axes of the reels 1 and 2, so that the application of excessive tensile force or generation of slack in respect of the metal sheets 3 and 4 can be reliably prevented from occurring, by obtaining the tensile force applied to the metal sheets 3 and 4 from detected values of the torque applied to the axes of the reels 1 and 2 and of the roll size of the rolls 5 and 6, obtaining a required torque for applying the torque to the axes of the reels 1 and 2 so as to render the applied tensile force to be constant, and causing such required torque to be generated.

Further, the apparatus for manufacturing the laminates to which the present invention relates comprises a stacked block forming device including first and second continuous metal sheet rolls 5 and 6 of first and second continuous metal sheets 3 and 4 respectively wound on each of two reels 1 and 2, driving power sources for transferring the first and second rolls 5 and 6 respectively in vertical directions and in horizontal directions, and a working table 11 on which a laminate block 12 formed by stacking the first and second continuous metal sheets 3 and 4 and synthetic resin sheet members 9 with insulating interlayers 10 alternately interposed is placed; an electric power source 14 for electrically heating the first and second metal sheets 3 and 4 in the laminate block 12; and a molding press 15 for pressing the laminate block 12 in a state of being electrically heated.

With the above arrangement employed, the first and second rolls 5 and 6 are transferred respectively in vertical and horizontal directions by operating the power sources for tensioning the first and second continuous metal sheets 3 and 4, whereby the metal sheets 3 and 4 used upon forming the laminate block 12 can be kept in tension, and any wrinkle, doubling or tear of the metal sheets 3 and 4 due to their slack can be prevented from occurring even in the event where the metal sheets 3 and 4 employed are thin.

Further, the apparatus for manufacturing the laminates to which the present invention relates comprises a laminate block forming device provided with first and second continuous metal sheet rolls 5 and 6 of first and second continuous metal sheets 3 and 4 respectively wound on each of two reels 1 and 2, with first and second stepped rollers 40 and 41 disposed to correspond to the first and second rolls 5 and 6 and vertically movable for tensioning the first and second metal sheets 3 and 4, with first and second transfer bases 52 and 53 by which the first and second rolls 5 and 6 as well as the first and second stepped rollers 40 and 41 are born at their shafts, with first and second driving sources for horizontally transferring the first and second transfer bases 52 and 53, and with a working table 11 on which a laminate block 12 of the first and second metal sheets 3 and 4 and synthetic resin sheet members 9 stacked with insulating interlayers 10 alternately interposed is placed; an electric power source 14 for electrically heating the first and second metal sheets 3 and 4 in the laminate block 12; and a molding press 15 for pressing the laminate block 12 in a state of being electrically heated.

With the above arrangement employed, the first and second transfer bases 52 and 53 bearing the first and second stepped rollers 40 and 41 are transferred horizontally by the driving sources, while keeping the first and second metal sheets 3 and 4 in tension by means of the first and second stepped rollers 40 and 41, whereby the metal sheets 3 and 4 being used in forming the stacked block 12 can be tensioned so that, even when the metal sheets 3 and 4 employed are thin, any wrinkle, doubling or tear due to a slack can be prevented from occurring.

Further, the apparatus for manufacturing the laminates to which the present invention relates, comprises a stacked block forming device provided with first and second continuous metal sheet rolls 5 and 6 or first and second continuous metal sheets 3 and 4 respectively wound on each of two reels 1 and 2, with first and second stepped rollers 50 and 51 disposed corresponding to the first and second rolls 5 and 6 and vertically movable for tensioning the first and second metal sheets 3 and 4, with first and second transfer bases 62 and 63 for supplying the first and second metal sheets 3 and 4 while being horizontally transferred, with first and second driving power sources horizontally transferring the first and second transfer bases 62 and 63, and with a working table 11 disposed between the first and second rolls 5 and 6 for placing thereon the laminate block 12 formed by stacking the first and second metal sheets 3 and 4 and synthetic resin sheet members 9 with insulating interlayers 10 alternately interposed; an electric power source 14 for electrically heating the first and second metal sheets 3 and 4 in the laminate block 12; and a molding press 15 for pressing the laminate block 12 in a state of being electrically heated.

With the above arrangement employed, it is enabled to keep the continuous metal sheets 3 and 4 in tension while being used in forming the laminate block 12, by supplying the first and second metal sheets 3 and 4 from the first and second transfer bases 62 and 63 while stretching the metal sheets 3 and 4 by the first and second stepped rollers 50 and 51, and transferring horizontally the first and second transfer bases 62 and 63 by means of the driving power sources, so that any wrinkle, doubling or tearing of the metal sheets 3 and 4 due to their slackening can be prevented from occurring, even when the metal sheets 3 and 4 employed are thin.

In this laminate manufacturing apparatus, a brake unit 19 should desirably be provided for braking the rotation of shafts of the reels 1 and 2, so that the continuous metal sheets 3 and 4 can be prevented from being excessively drawn out by applying a damping force of a level not allowing the reels 1 and 2 to rotate with the inertial force of rotation upon termination of the rotation of the reels caused when the metal sheets 3 and 4 are drawn thereout.

To the shafts of the reels 1 and 2, a resistance to rotation of a value more than a certain level should desirably be provided, so that the continuous metal sheets 3 and 4 can be prevented from being excessively drawn so as to control the inertial rotation of the reels 1 and 2.

It is desirable to provide a rotary driving power source to the shafts of the reels 1 and 2, so that the tensile force applied to the continuous metal sheets 3 and 4 when they are drawn can be reduced, by means of a torque applied by the rotary driving power source to the shafts in a direction of assisting the drawing of the metal sheets 3 and 4.

It is desirable to provide a rotary driving means for providing to the shafts of the reels 1 and 2 a torque effective to wind up the continuous metal sheets 3 and 4, so that the rotary driving means will act as a brake for stopping the rotation of the reels 1 and 2, so as to prevent any excessive rotation due to the inertial force of rotation of the reels 1 and 2, and also to prevent the metal sheets 3 and 4 from being excessively drawn out. Further, even in an event where the metal sheets 3 and 4 are excessively drawn out, they can be rewound to restrain their slack.

It is desirable that a mechanism for vertically moving the working table 11 for stacking thereon the laminates in multiple layers, so that working level can be positioned always at a constant height by vertically moving the working table 11 in accordance with the height of stacking, and consequently the locus of the outlets 16 of the reels 1 and 2 can be made constant.

It is desirable that the reels 1 and 2 are provided at their shafts with a shock absorber, so that any shocking tensile force can be prevented by the shock absorber from being applied to the continuous metal sheets 3 and 4, and thus the sheets can be prevented from being torn.

Other objects and advantages of the present invention shall become clear as the description advances as detailed with reference to respective embodiments shown in accompanying drawings.

BRIEF DESCRIPTION OF THE DRAWINGS

FIGS. 21a to 21c are explanatory views for the operation in another embodiment of the present invention;

FIGS. 22a to 22d are explanatory views for the operation in another embodiment of the present invention;

FIGS. 23a and 23b are side and front views of part of the apparatus in another embodiment according to the present invention;

FIGS. 27a and 27b are explanatory views for the stacking step in the embodiment of FIG. 26;

FIGS. 28a and 28b are explanatory view for the stacking step in the embodiment of FIG. 26;

FIGS. 31a and 31b are explanatory views for the stacking step in the embodiment of FIG. 26;

FIGS. 32a and 32b are explanatory views for the stacking step in the embodiment of FIG. 26;

FIGS. 33a and 33b are explanatory views for the stacking step in the embodiment of FIG. 26;

FIGS. 35a and 35b are explanatory views for the stacking step in the embodiment of FIG. 34;

FIGS. 37a and 37b are explanatory views for the stacking step in the embodiment of FIG. 34;

FIGS. 38a and 38b are explanatory views for the stacking step in the embodiment of FIG. 34;

FIGS. 39a and 39b are explanatory views for the stacking step in the embodiment of FIG. 34;

FIGS. 40a and 40b are explanatory views for the stacking step in the embodiment of FIG. 34;

FIG. 44a is an explanatory view for the locus of the outlet of the reel in the operation of FIG. 42;

FIG. 44b is a diagram for explaining the relationship between the transfer speed and the position of the continuous metal sheet roll in the operation of FIG. 42.

While the present invention shall now be described with reference to the respective embodiments shown in the accompanying drawings, it should be appreciated that the intention is not to limit the present invention only to these embodiments but rather to include all alterations, modifications and equivalent arrangements possible within the scope of appended claims.

DETAILED DESCRIPTION OF THE PREFERRED EMBODIMENTS

Figure 1:
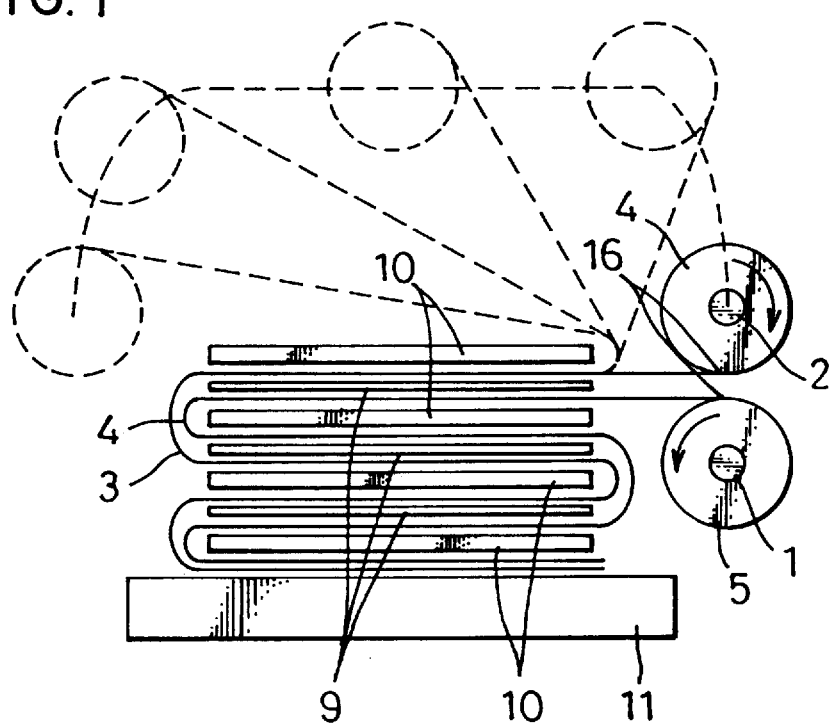
FIG. 1 is a schematic explanatory view of an embodiment of the apparatus for manufacturing laminates according to the present invention.
Figure 2:
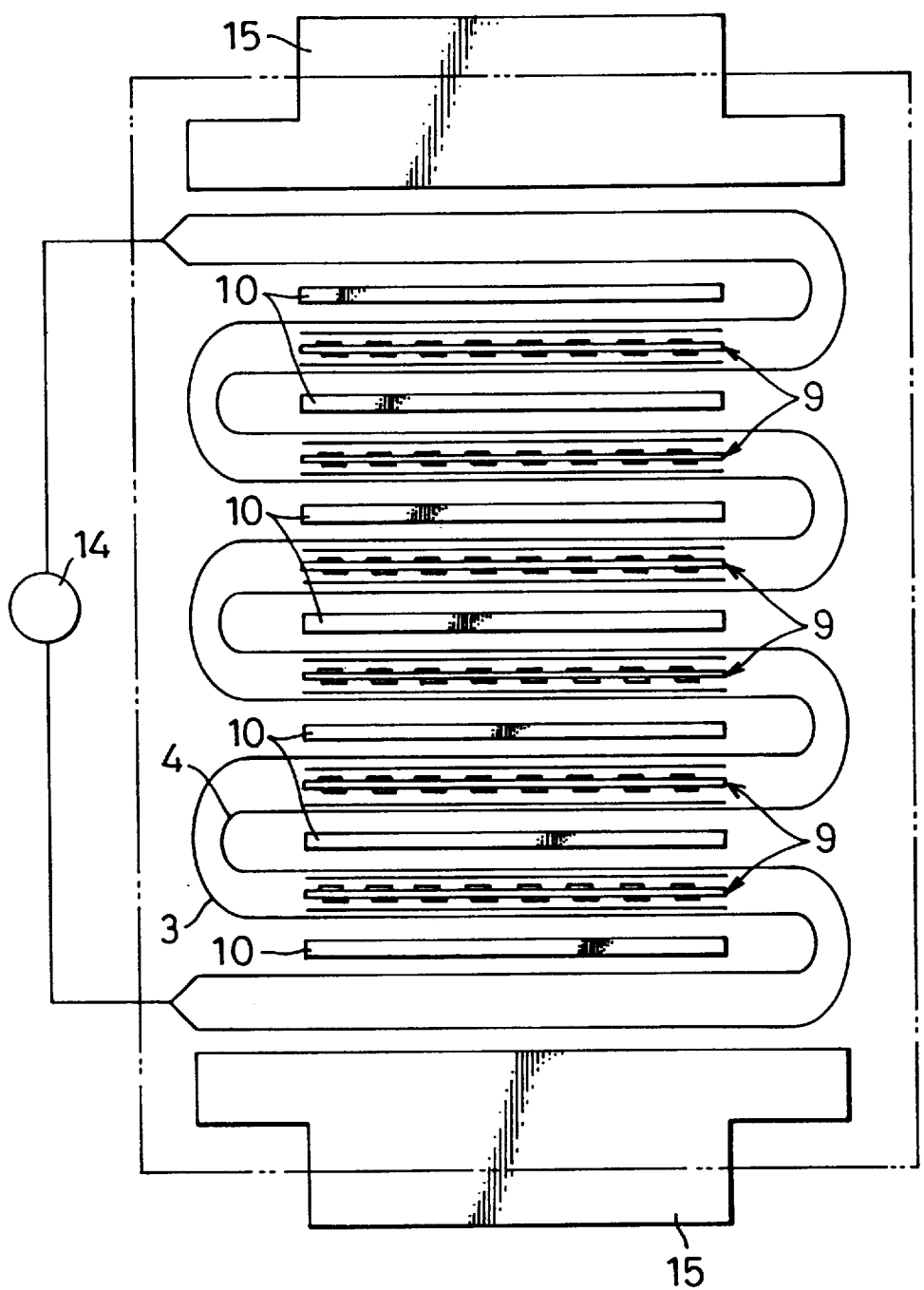
FIG. 2 is a schematic side elevation showing stacking state in the embodiment of FIG. 1.
Figure 3:
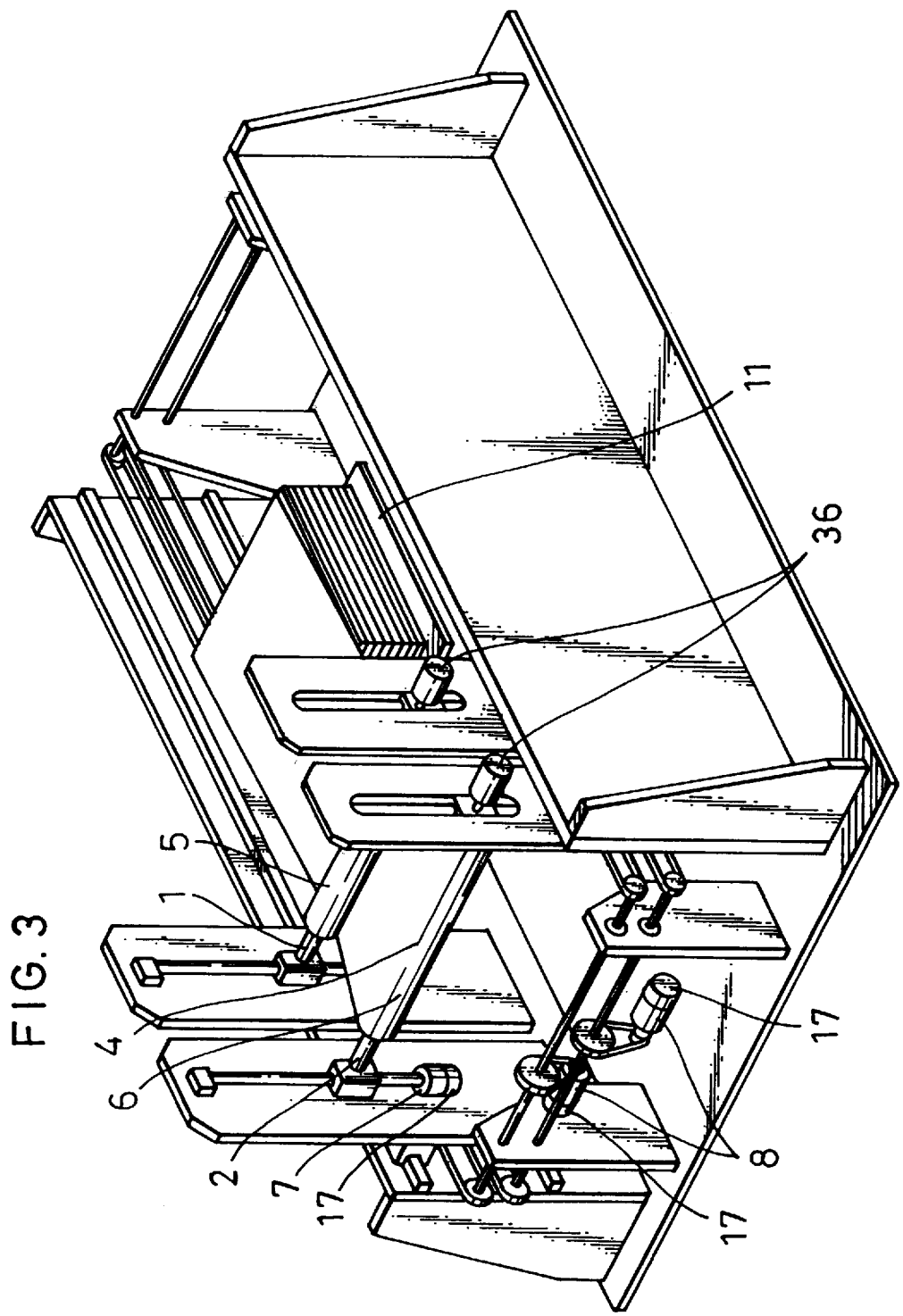
FIG. 3 is a perspective view of the apparatus of the embodiment shown in FIG. 1.

An embodiment of the apparatus for manufacturing laminates according to the present invention shall be described in the followings, with reference to FIGS. 1 to 3, in which the apparatus is constituted by a laminate block forming device comprising first and second continuous metal sheet rolls 5 and 6 of first and second continuous metal sheets 3 and 4 respectively wound on each of reels 1 and 2, motors 7 and 8 for transferring the first and second rolls 5 and 6 respectively in vertical directions and horizontal directions so as to stretch the first and second metal sheets 3 and 4, and a working table 11 on which a laminate block 12 formed by stacking the first and second continuous metal sheets 3 and 4 and synthetic resin sheet members 9 with insulating interlayers 10 alternately interposed is placed; a power device 14 for supplying a current to the first and second metal sheets 3 and 4 in the laminate block 12 to thereby generate a heat for an electrical heating; and a molding press 15 for pressing the laminate block 12 in the state of being electrically heated. The laminate block 12 formed on the working table 11 is conveyed onto such molding press 15 as in FIG. 2 by means of, for example, a conveyer, and is pressed by the molding press 15 while being subjected to the electrical heating through the continuous metal sheets 3 and 4.

Here, the continuous metal sheets 3 and 4 consist respectively of an elongated copper sheet, and the metal sheets 3 and 4 are connected at both longitudinal ends to the power device 14, so that a current will be supplied from their one end to the other end. Copper foils each being 18 μm thick, for example, are employed as the continuous metal sheets 3 and 4, and two of such continuous copper foils are sequentially folded back into a meandering shape so that folded portions of the sheets 3 and 4 and between respective combined stacks will be desposed alternately on opposite side. The copper foils act as an electric resistor which negerates required heat so that, when a proper pressure is applied to the block 12 through a cold pressing, respective constituents are caused to adhere each other, and a plurality of the laminates are molded simultaneously. The power device 14 forming an electric heating means is connected to both longitudinal ends of the continuous metal sheets 3 and 4 of the two copper foils, so that a current will be supplied to the metal sheets which function as the electric resistor to have a heat generated. For the current, an alternating current may be also employed.

The synthetic resin sheet member 9 comprises a set of a glass cloth base carrying inner layer circuits formed on both side surfaces, and an inner layer substrate of epoxy resin and carrying on both surfaces prepregs of glass cloth impregnated with epoxy resin, so that a multilayered circuit board of four layer structure, for example, can be manufactured as the laminate.

The interlayer 10 is for ensuring the flatness of the respective laminates, and an aluminum plate having on its surfaces an electrically insulating coating of 30 to 60 μm thick and formed on the surfaces treated to have a hard anticorrosion layer and then impregnated with tetrafluoroethylene is used.

To the motors 7 and 8 forming the driving power source, there are provided encoders 17 for measuring the rotary angle of the motors 7 and 8 rotated to transfer the continuous metal sheet rolls 5 and 6. The molding press 15 is employed for a pressure molding of the laminate combinations formed by stacking the synthetic resin sheet member 9 and continuous metal sheets 3 and 4, upon which pressure molding the continuous metal sheets are simultaneously heated electrically by the electric heating means, the synthetic resin sheet members 9 are heated thereby, and the laminate combinations are hot-press molded into the laminates. This molding press 15 may also be replaced by a vacuum laminate press formed to cover a press body within a vacuum chamber.

Further, the two reels 1 and 2 on which the continuous metal sheets 3 and 4 are wound are transferred vertically by means of the motors 7 driven as coupled to pole screws, and are also transferred in a direction from one end edge to the other end edge of the working table 11 by means of the motors 18. With this drive force, a transfer of the continuous metal sheet rolls 5 and 6 in their axial direction is made possible.

Next, a concrete working aspect for stretching in tension the continuous metal sheets 3 and 4 between the outlets 16 of the reels 1 and 2 and each end edge of the laminate block 12 shall be referred to in the followings.

Figure 4A:
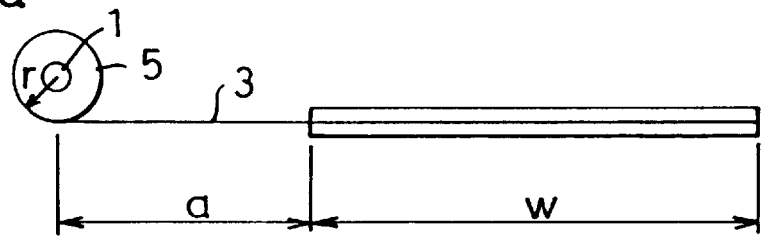
FIGS. 4a and 4b are explanatory views for the operation in the beginning of transfer of one of the continuous metal sheet rolls in the embodiment of FIG. 1.
Figure 4B:
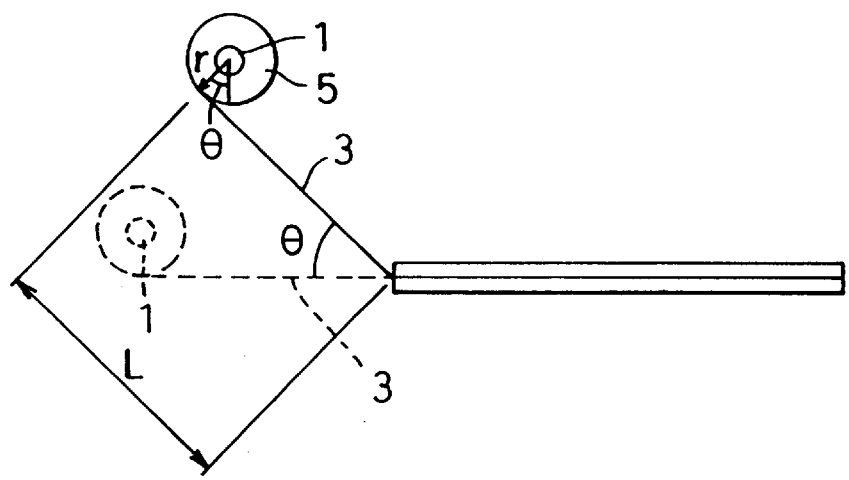
Figure 5A:
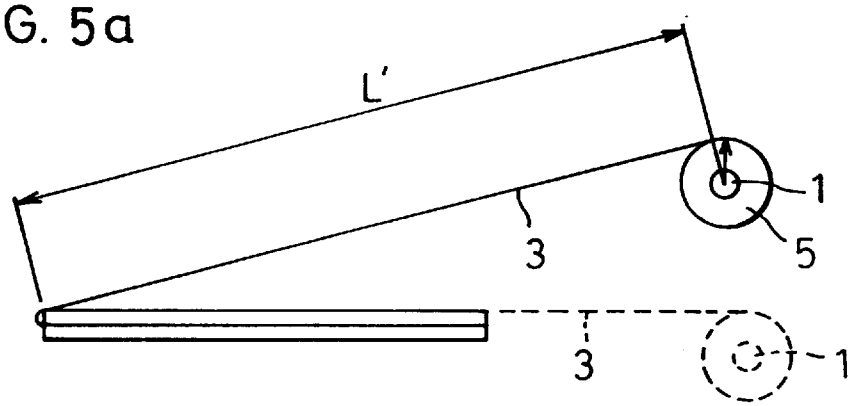
FIGS. 5a and 5b are explanatory views for the operation at the end of the transfer of the metal sheet roll and upon termination of the transfer.
Figure 5B:
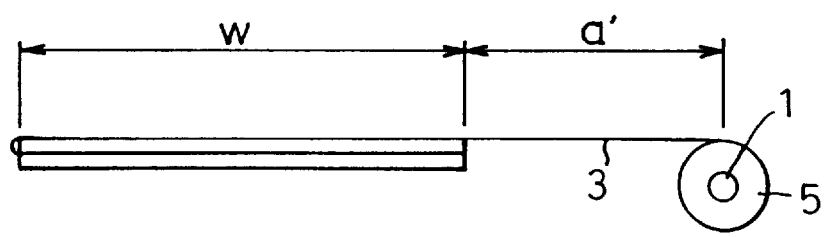
Figure 6:
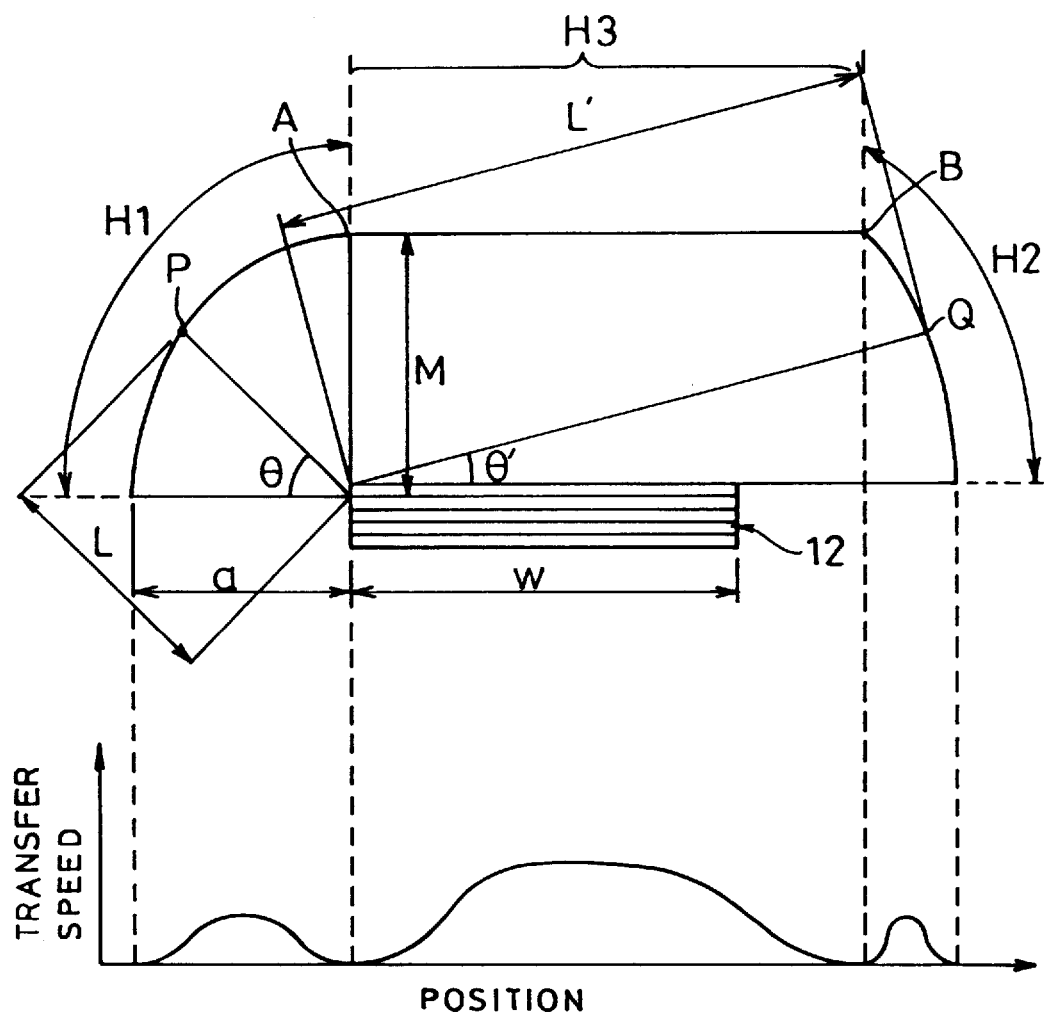
FIG. 6 is an explanatory diagram for the locus of the outlets of the reels in the embodiment of FIG. 1, as well as the relationship between the moving speed and the position of the metal sheet roll in the embodiment of FIG. 1.

A transfer path of the metal sheet rolls 5 and 6 is so set that the locus of the outlets 16 of the reels 1 and 2 will be as shown in FIGS. 4 to 6. More concretely, as seen in FIG. 6, the drawing amount of the continuous metal sheets upon starting and terminating the transfer of the rolls 5 and 6 will correspond to relative rotation of the rolls with respect to the end edge of the laminated block, and the continuous metal sheets are not caused to be slackened. Further, between the start and the termination of the transfer of the rolls 5 and 6, the locus (curved locus H1→straight locus H3→curved locus H2) is achieved for gradually drawing the metal sheets out of the rolls 5 and 6. That is, provided that the reel 1 is almost not rotated within the curved loci H1 and H2, the laminate block 12 of FIG. 6a has a width w, the drawing amount of the metal sheets upon starting of the transfer is made a, and the radius of the roll 5 is r, then the length L of the metal sheet at a point P on the curved locus H1 (FIG. 6a) is (a+rθ) while the length M at terminating end A of the curved locus H1 is (a+π·r/2), the drawing amount of the metal sheet on the curved locus H1 is gradually increased while the length L' of the metal sheet at a point Q on the curved locus H2 is (a'+w−rθ'), and the drawing amount of the metal sheet on the curved locus H2 is gradually reduced. Here, the arrangement is so made that the continuous metal sheet roll 5 is transferred sufficiently gradually for not causing the reel 1 to be excessively rotated by the inertial force of rotation of the reel due to the drawing of the continuous metal sheet 3, so that the metal sheet 3 can be prevented from being excessively drawn and thus from being slackened, and the stacking work can be performed with the metal sheet 3 stretched at all times.

Figure 42A:
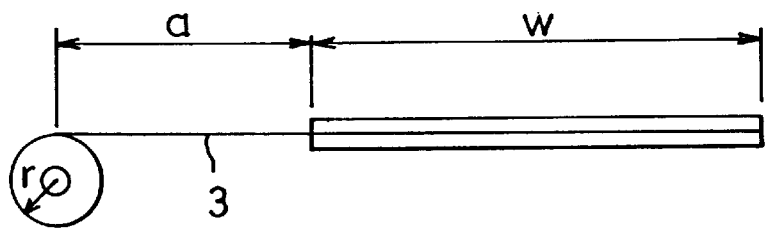
FIGS. 42a and 42b are explanatory views for the operation in the beginning of the transfer of the continuous metal sheet roll in another embodiment.
Figure 42B:
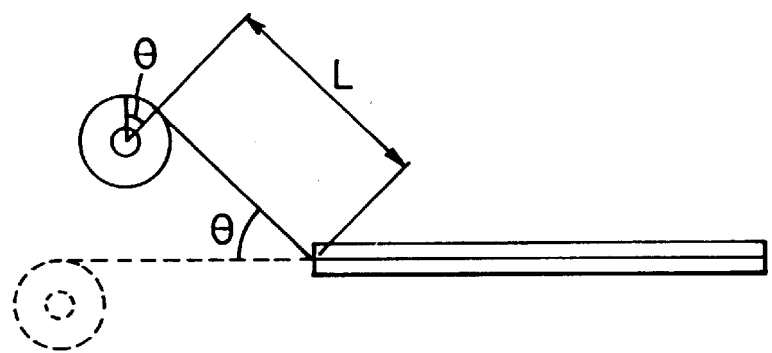
Figure 43A:
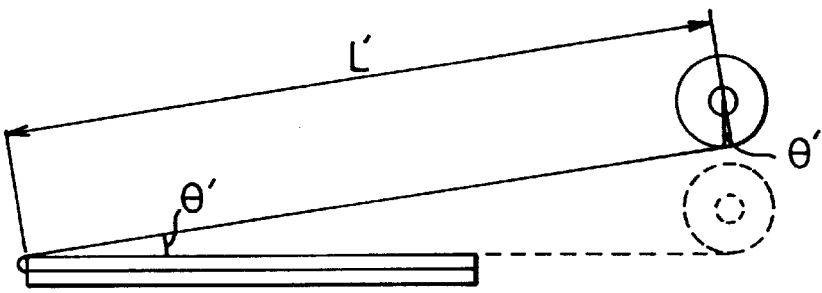
FIGS. 43a and 43b are explanatory views for the operation before termination and upon termination of the transfer of the roll in FIG. 42.
Figure 43B:
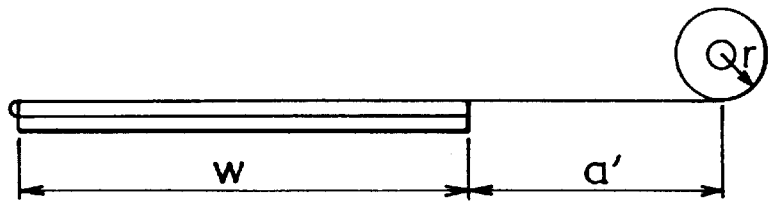

In the above, the arrangement may also be so made as to have the positional relationship between the roll and the metal sheet as in FIGS. 4 to 6 reversed as in FIGS. 42 to 44, in which event the outlet of the reel is positioned on upper side of the roll when the roll is on such curved locus between points B and E as shown in FIG. 44, so that this curved locus between the points B and E will be a concave locus opposite to the convex locus H2 of FIG. 6, whereas the prevention of slack of the metal sheet can be attained in the same manner as in the aspect of FIG. 6 and the stacking work can be performed with the continuous metal sheet 3 stretched at all times also in the working aspect of FIGS. 42 to 44.

Next, manufacturing steps for the laminates shall be summarized in the followings.

Figure 11A:
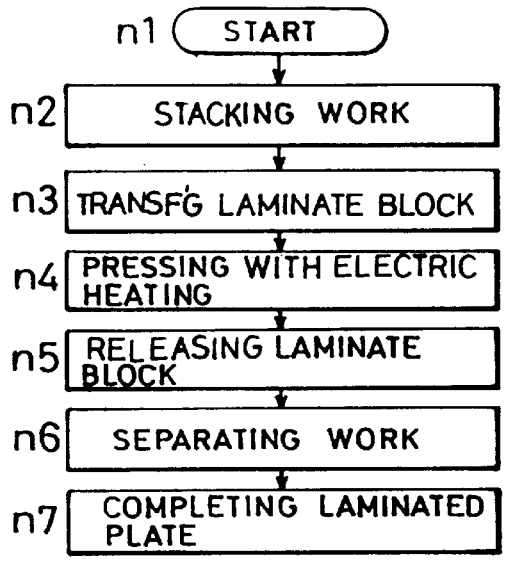
FIG. 11a is a flow-chart of the entire work of the embodiment of FIG. 1.
Figure 11B:
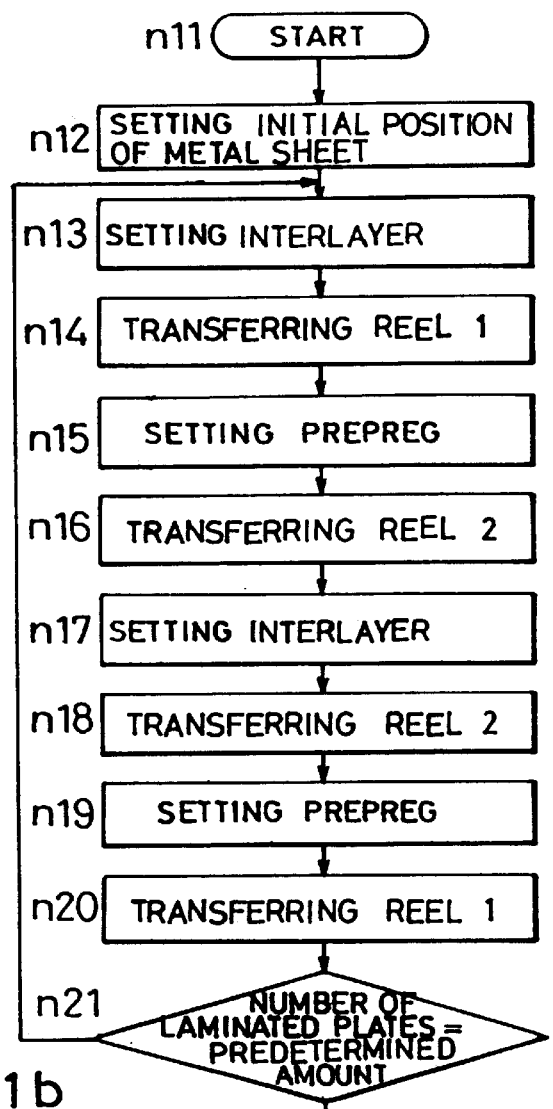
FIG. 11b is a flow chart of the stacking work of the above.

In FIG. 11a, steps n1 to n7 show a control flow of the entire work, while steps n11 to n26 in FIG. 11b show a control flow of the stacking work. At first, at the step n12 in FIG. 11b, the continuous metal sheets are set at initial position and, then, the interlayer is placed on the sheets at the step n13. Thereafter, the reels 1 and 2 are sequentially transferred to have the continuous metal sheets folded back while interposing between the sheets alternately the interlayers and such synthetic resin sheet members as the prepregs. Such a series of operation of these steps n13–n20 is repeated until a predetermined number of the laminates is reached. At further steps n22–n24, the last interlayer is placed and then both reels 1 and 2 are transferred, the continuous metal sheets now overlapping each other are cut at step n25, and the laminated block is formed.

The laminate block obtained through such stacking work is moved at step n3 of FIG. 11a to be set in the molding press accompanying the electric heating means, the block is pressed at step n4 while heating it through the continuous metal sheets to which the electric current is supplied, the thus pressed block is released from the molding press and subjected to a separating work at steps n5 and n6, and a plurality of the laminates are completed at step n7.

An example of the foregoing stacking work shall be described concretely.

Figure 7A:
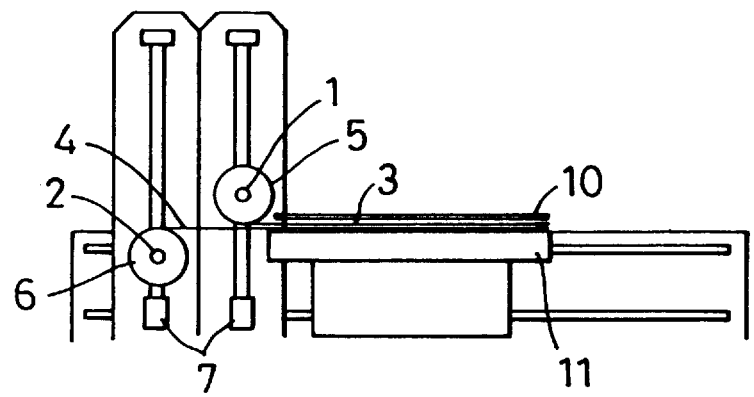
FIGS. 7a and 7b are explanatory views for stacking step in the embodiment of FIG. 1.
Figure 7B:
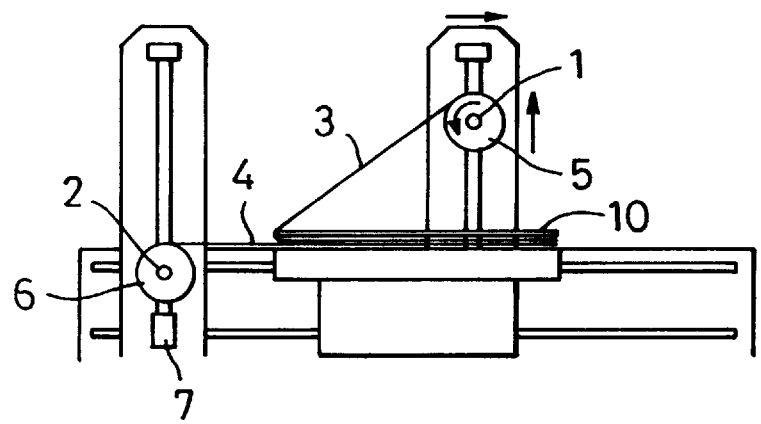
Figure 8A:
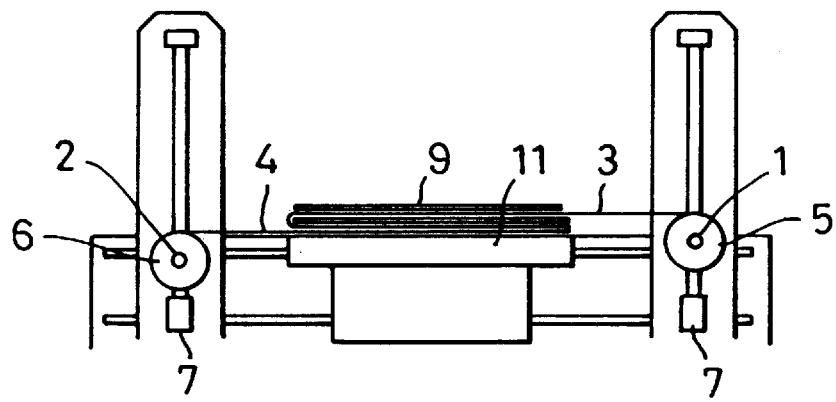
FIGS. 8a to 8c are explanatory views for the stacking step in the embodiment of FIG. 1.
Figure 8B:
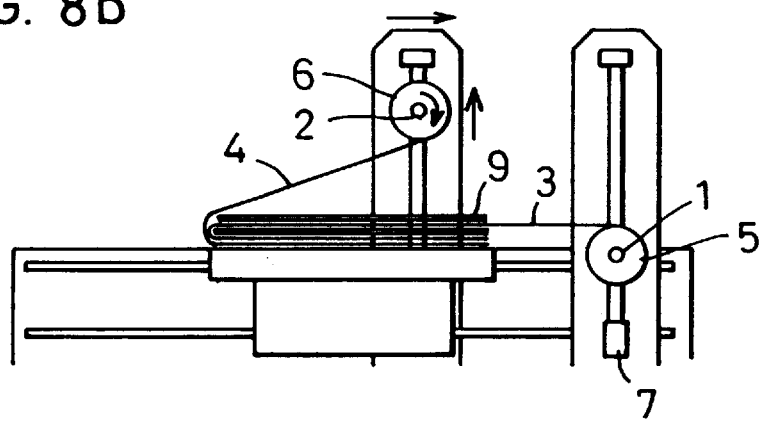
Figure 8C:
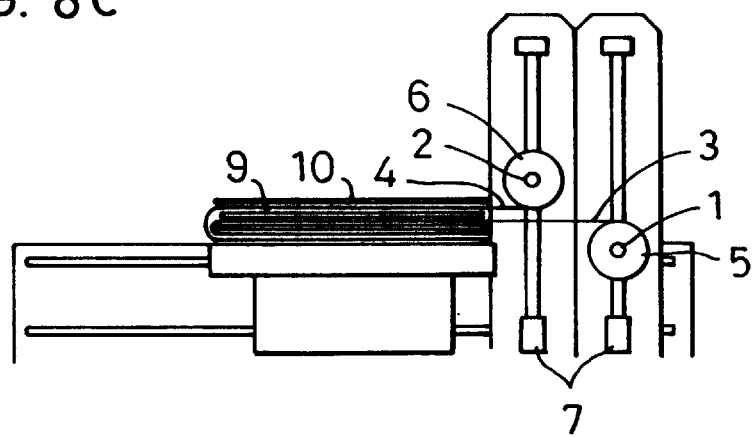
Figure 9A:
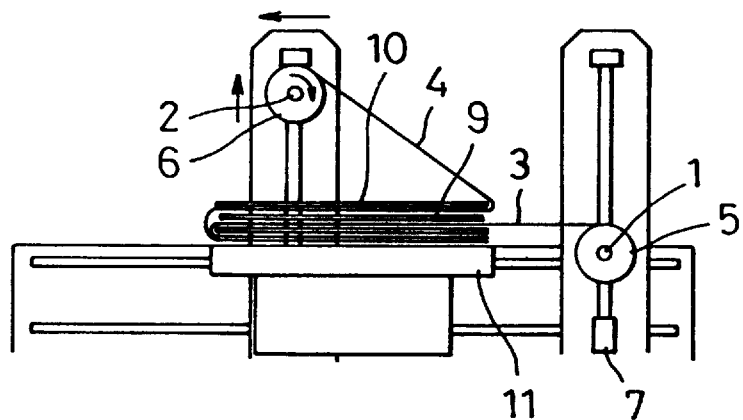
FIGS. 9a and 9b are explanatory views for the stacking step in the embodiment of FIG. 1.
Figure 9B:
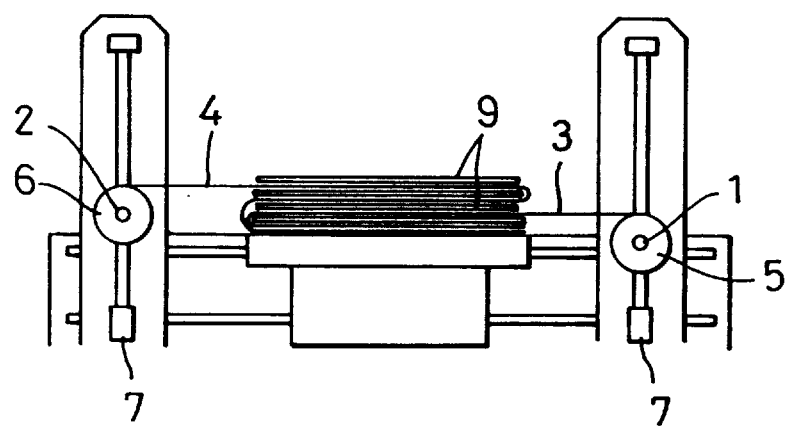
Figure 10A:
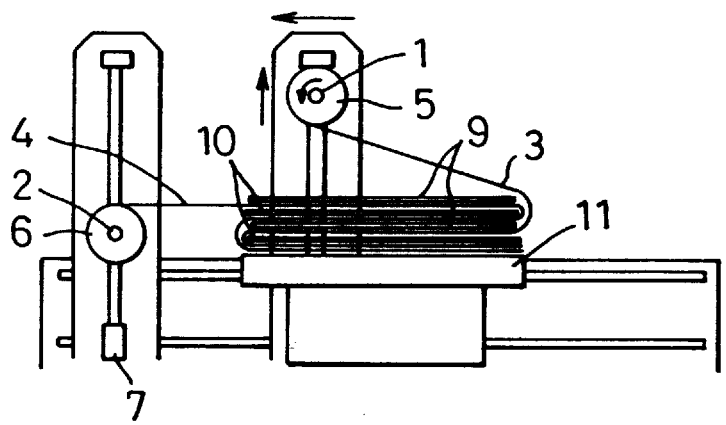
FIGS. 10a and 10b are explanatory views for the stacking step in the embodiment of FIG. 1.
Figure 10B:
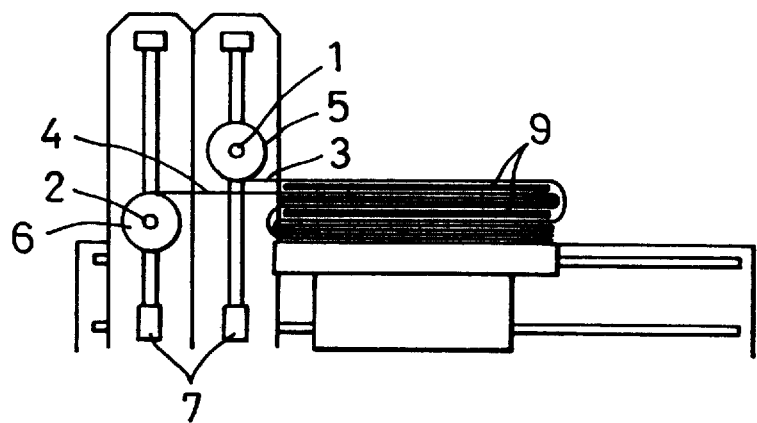

Now, the two continuous metal sheets 3 and 4 are set on the working table 11 and one interlayer 10 is placed thereon, as shown in FIG. 7a. Then, the reel 1 and metal sheet roll 5 are transferred passing over the interlayer 10 while drawing the metal sheet 3 as kept in tension out of the roll 5 (FIG. 7b). The metal sheet 3 is overlapped on the interlayer 10 to cover it, and then such synthetic resin sheet member 9 as a prepreg is placed on the metal sheet 3 (FIG. 8a). Next, the other reel 2 and metal sheet roll 6 are transferred in a direction of passing over the working table 11 while drawing the metal sheet 4 as kept in tension out of the roll 6, and the metal sheet 4 is overlapped on the resin sheet member 9 to cover it (FIGS. 8b and 8c). Another interlayer 10 is then placed on the metal sheet 4 (also FIG. 8c). Similarly, this metal sheet 4 is folded backward to cover the interlayer 10, with the reel 2 and roll 6 transferred back (FIG. 9a). Another resin sheet member 9 is placed on the metal sheet 4 (FIG. 9b). Then, the reel 1 and roll 5 are transferred back to have the metal sheet 3 folded back and laid over the resin sheet member 9 as kept in tension (FIGS. 10a and 10b). Following this, the further interlayers 10 and resin sheet members 9 are alternately stacked with each of the metal sheets 3 and 4 alternately interposed between them, so that the respective interlayers 10 will be disposed between the respective laminate combinations, and the laminate block 12 is formed with the laminate combinations stacked in multiple layers.

After such formation of the laminate block 12 as in the above, the block 12 is pressed by means of the pressure plates of the molding press 15, from the top and bottom sides of the block. For the molding press 15, for example, a vacuum laminate press formed to cover its press body with a vacuum chamber is employed, a vacuum is drawn in the interior of the vacuum chamber of this vacuum laminate press to a level of 10 Torr, thereafter the block is pressed from the top and bottom sides under a pressure of 10 kgf/cm$^2$ and, at the same time, a DC current is supplied to the two continuous copper foils from the power source of the electrically heating means to which both ends of the foils are connected, so as to have a heat generated by the foils acting as the electric resistor, and the heating is performed. The hot pressing is performed for 100 minutes while executing a feedback control of the supplied current value so as to attain 180° C., with the temperature of the laminate combinations measured by means of a thermocouple during the heating. The resin sheet members 9 are thereby heated, and the laminate combinations respectively including the resin sheet member 9 are thermoformed under the pressure, into the laminates. In the arrangement of FIG. 2, six of the laminates are concurrently manufactured with stacking number of the laminate combinations increased, the concurrent manufacture of a still larger number of the laminates is made possible. While the metal foils are made as the two continuous metal sheets, it is also possible to employ a single metal sheet by disposing it on both sides of the respective laminate combinations.

As has been described, the stacking work is carried out by stretching the continuous metal sheets 3 and 4 between the outlets 16 of the reels 1 and 2 and each end edge of the laminate block 12, so that the metal sheets 3 and 4 are prevented from being slackened and from being caused to be wrinkled up or doubled up, whereby the operator is freed from any manual winding or unwinding of the metal sheets 3 and 4 as has been required, and the manufacture can be speeded up with required working time shortened. At the same time, the working steps can be easily automated, and the working efficiency can be further elevated.

Further, the stacking work is rendered to be carried out while keeping the continuous metal sheets 3 and 4 in tension at all times, by performing the transfer of the continuous metal sheet rolls 5 and 6 sufficiently gradually for not allowing the reels 1 and 2 to be excessively rotated due to the inertial force of rotation of the reels caused upon drawing out of the metal sheets 3 and 4 upon starting and terminating the transfer of the rolls 5 and 6, by means of the well set locus of the outlets 16 of the reels 1 and 2. At the same time, the rotating speed of the reels 1 and 2 resulting from the drawing of the continuous metal sheets 3 and 4 thereout is adjusted, so that the metal sheets can be prevented from being excessively drawn out with any excessive rotation of the reels 1 and 2 due to the inertial force of rotation of them, and any wrinkle or doubling can be prevented from occurring. Further, any shockingly applied force of tension to the metal sheets 3 and 4 at the time when the reels 1 and 2 shift from their standstill state to rotating state can be reduced, and the metal sheets 3 and 4 can be prevented from being torn out upon starting of the transfer of the rolls 5 and 6.

In employing the locus of FIG. 6a, the rotating speed of the reel 1 (likewise the reel 2) caused by the drawing of the metal sheet is made to be gradually reduced when the speed of transfer is gradually reduced up to the point B entering from the straight locus H3 to the curved locus H2 as shown in FIG. 6b, whereby the inertial force of rotation of the reel 1 can be minimized to prevent the reel 1 from being excessively rotated and also the metal sheet 3 from being excessively drawn. Further, by stopping once the transfer of the roll 5 at the point A of shift from the curved locus H1 to the straight locus H3 and thereafter starting again the transfer with a small acceleration, the shockingly applied force of tension to the metal sheet can be further reduced.

In an event when such speed control is impossible, the arrangement may be so made that the rotating speed of the reel 1 (likewise the real 2) caused by the drawing of the metal sheet is adjusted by means of the locus. That is, when the rotating speed abruptly rises at the point A as in FIG. 6, there arises a risk that the shocking tensile force is applied to the metal sheet. Here, the curved locus H1' in the beginning of the transfer should make a slight detour as shown by a solid line in FIG. 13 with respect to the curved locus H1 (broken line) in the beginning of transfer of FIG. 6, whereby the rotating speed of the roll 5 can be rendered to be gradually raised, and the tensile force shockingly applied to the metal sheet can be reduced. Further, by rendering the curved locus H2' from point B' to the terminating point of the transfer to make a slight shortcut with respect to the curved locus H2 of FIG. 6, the rotating speed of the reel 1 caused by the drawing of the metal sheet 3 can be reduced gradually, and the reel 1 can be prevented from being excessively rotated due to the inertial force of its rotation. That is, any rotation component due to the inertial force of the reel 1 can be sufficiently absorbed by means of the shortcut curved locus H2', and the metal sheet can be prevented from being excessively drawn out. Further, the shockingly applied force of tension to the metal sheets 3 and 4 upon shifting of the reels 1 and 2 from the standstill state to the rotating state can be reduced, and the metal sheets 3 and 4 can be prevented from being torn out also in the beginning of the transfer of the rolls 5 and 6.

Figure 45:
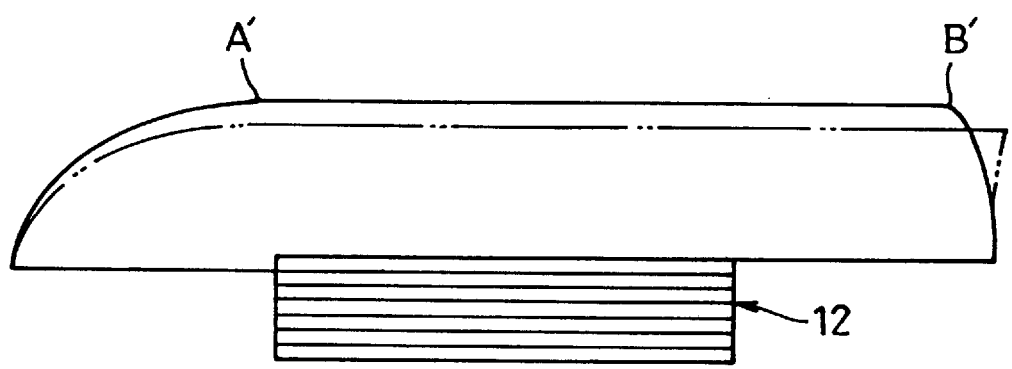
FIG. 45 is an explanatory view for a modified example of the locus of the outlet as in FIG. 42.

Even when such curved and straight locus as in FIGS. 42–44 and different from those of FIGS. 4–6 are drawn, it is made possible to gradually raise the rotating speed of the continuous metal sheet roll 5, by rendering the curved locus in the beginning of the transfer to make a slight detour as shown by a solid line in FIG. 45 in contrast to the one of FIG. 44 (shown in FIG. 45 by a double-dot chain line), and the shockingly applied force of tension to the metal sheets can be reduced. Further, by smoothing the locus so that the curved locus from point B' to the end of the transfer will be rendered to make a slight shortcut and to gradually lose the rotation in contrast to a bent locus before termination of the transfer as in FIG. 44 (shown by the double-dot chain line in FIG. 45), the reel 1 can be prevented from being excessively rotated, and the metal sheet 3 can be prevented from being torn out.

Figure 12:
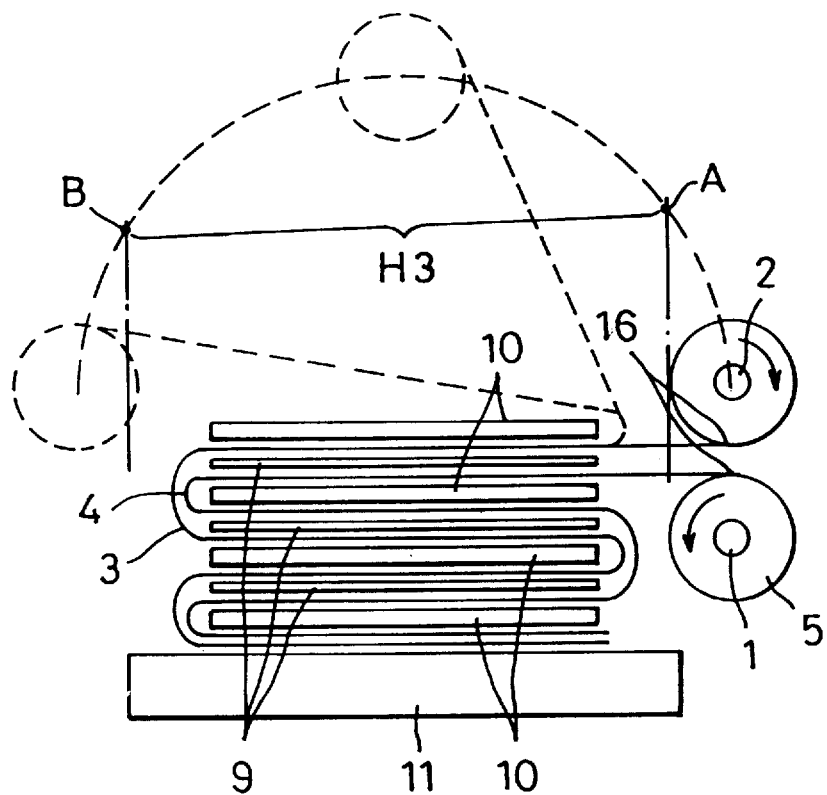
FIG. 12 is an explanatory view for another aspect of the locus of one of the outlets of the reels in the embodiment of FIG. 1.
Figure 13:
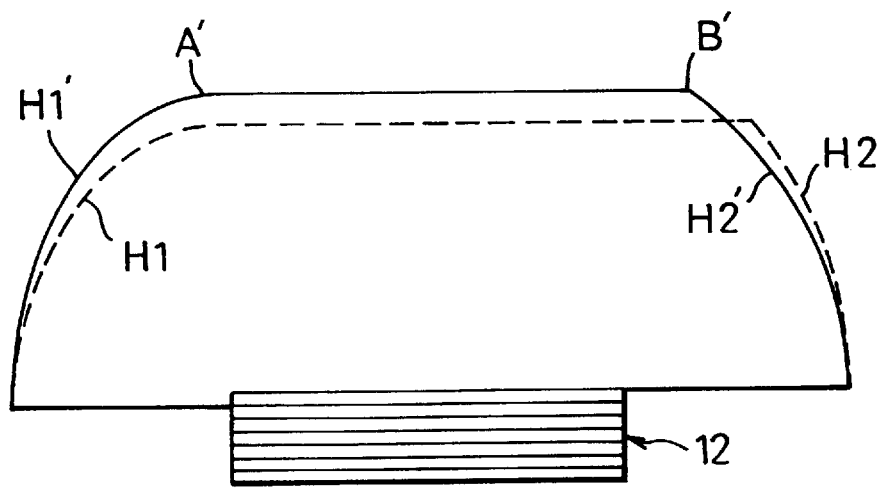
FIG. 13 is an explanatory view for another aspect of the locus of the outlet in FIG. 6.

Further, the locus of the outlet 16 of the reels 1 and 2 should not be limited to such combination of the curved and straight locus as shown in FIGS. 6, 13 and 44, but the straight locus between the points A and B, for example, may be such curved locus H3 as in FIG. 12.

Figure 14:
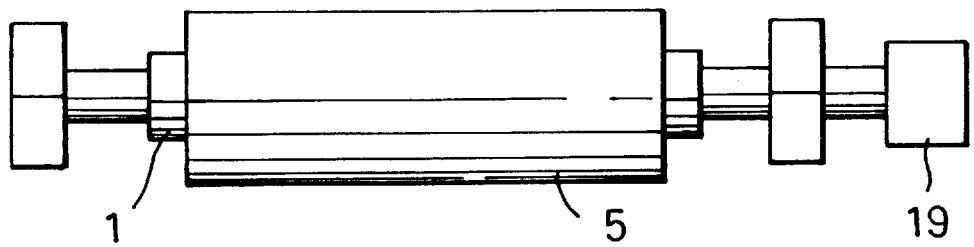
FIG. 14 is a side elevation of part of the apparatus in another embodiment of the present invention.

In an event where the apparatus of FIG. 3 is provided with such brake unit 19 as shown in FIG. 14 for stopping the rotation of the shafts of the reels 1 and 2, the excessive drawing of the metal sheets 3 and 4 can be prevented from occurring, the brake unit 19 is made to apply to the reels 1 and 2 a damping force of a level not allowing them to rotate due to the inertial force of rotation, upon termination of the rotation of the reels 1 and 2 due to the drawing of the metal sheets 3 and 4. For the brake unit 19, a powder brake, for example, may also be employed. This powder brake is of a construction which can freely set a damping torque by means of, for example, an electromagnetic force of electromagnetic device and a magnetic powder. In an example thereof, the construction comprises generally an electromagnetic part incorporting a solenoid and a rotary part including a driving side cylinder and a driven side rotor, the magnetic powder being inserted in a gas between the cylinder and the rotor, so that, when an excited state is attained with the solenoid energized, the cylinder and rotor are coupled by a coupling force of the powder to transmit a torque but are mutually released with the solenoid deenergized, and a constant damping force can be provided to the reels 1 and 2 by providing such powder brake to the shafts of the reels 1 and 2.

Further, in an event when rotary driving motors 36 for the two reel shafts are provided to the apparatus of FIG. 3 in order to drive the shafts of the reels 1 and 2 to be rotated, it is possible to have an inverse directional torque applied by these driving motors 36, so as to act as a damping force that stops the rotation of the reels 1 and 2 caused due to the drawing of the continuous metal sheets 3 and 4, whereby the reels 1 and 2 can be prevented from being excessively rotated due to the inertial force of rotation of them, and any excessive drawing of the metal sheets can be prevented from occurring. Provided that the metal sheets are even excessively drawn out, they can be rewound by means of the motors 36, and any wrinkle or crimp can be prevented from occurring in the metal sheets 3 and 4.

Figure 15A:
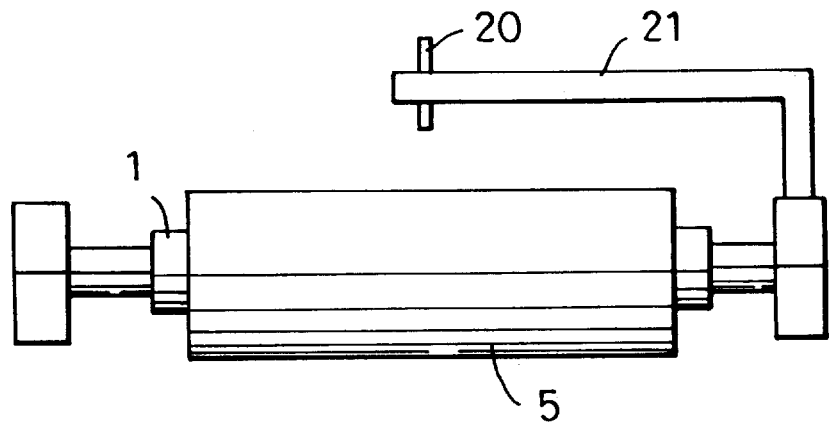
FIGS. 15a and 15b are side and front views of part of the apparatus in another embodiment of the present invention.
Figure 15B:
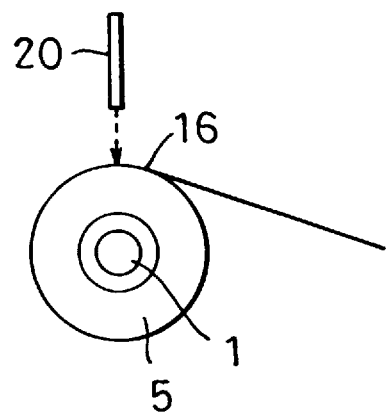

Further, when the roll size of the continuous metal sheet roll can be measured by means of a gap sensor 20, as shown in FIG. 15, so that the optimum locus at every moment of measurement can be set on the basis of measured value, it is enabled to render the locus of the outlets 16 of the reels 1 and 2 constant without requiring the operation to set the locus over again in view of any change in the roll size, and the stacking work can be improved in the safety. As shown in the drawing, the gap sensor 20 is held at position by a holding fixture 21.

Figure 16:
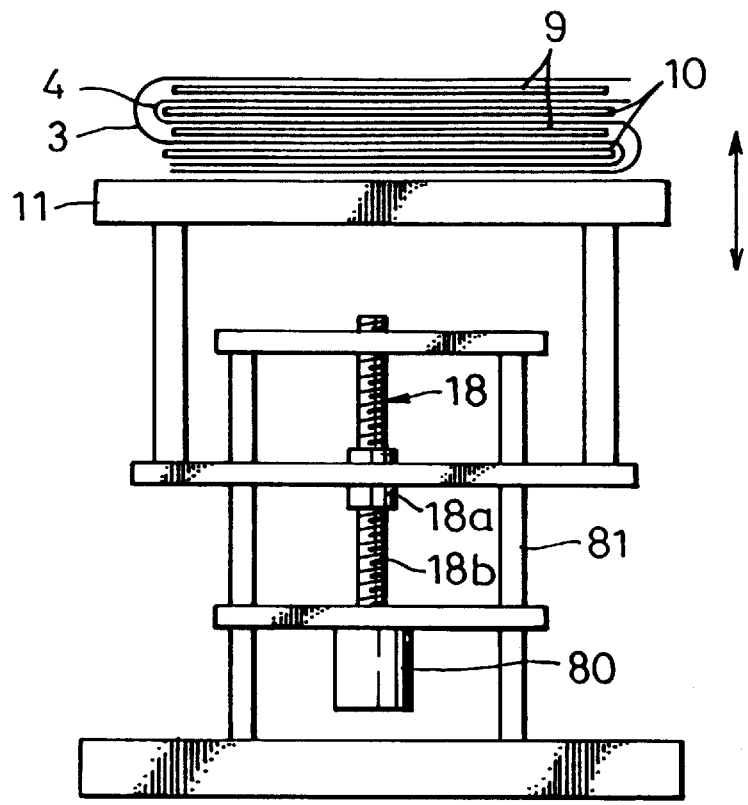
FIG. 16 is a schematic side elevation of the apparatus in another embodiment of the present invention.

FIG. 16 shows a working aspect, in which the apparatus comprises a mechanism for vertically moving the working table 11 on which the laminates are stacked in multiple layers. To a bottom plate of the working table 11, a nut member 18a on a threaded pole 18 is mounted, a lower end of male thread part 18b at which the pole is in mesh with the nut member 18a is coupled to a motor 80, and a non-threaded upper end of the pole is born through a bearing by a motor mounting frame 81. As the motor 80 rotates, the male thread part 18b of the pole 18 is thereby rotated. Since this male thread part 18b is fixed to the side of the motor 80, the nut part 18a on the thread part 18b is moved up and down following the rotation, and the working table 11 coupled to the nut part 18a is vertically moved. When such arrangement for vertically moving the working table 11 by means of the threaded pole 18 and motor 80 to form the laminate block 12 on this table 11, the working level can be maintained at a fixed height by lowering the table 11 as the laminate block 12 becomes higher. Consequently, the locus of the outlets 16 of the reels 1 and 2 can be kept constant irrespective of the height of the laminate block 12, and vertical occupying space of the apparatus can be prevented from being enlarged.

Figure 17:
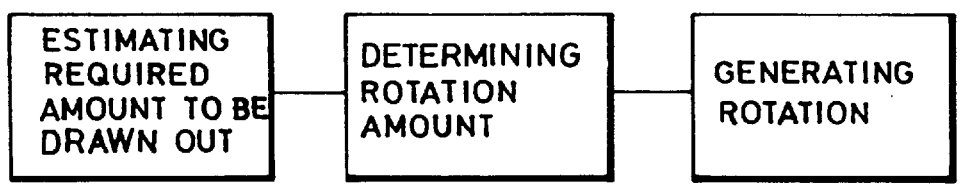
FIG. 17 is a block diagram for explaining another embodiment of the present invention.

FIG. 17 shows another embodiment in which the rotary driving of the reels 1 and 2 is synchronized with the transfer of the continuous metal sheet rolls 5 and 6. For example, a required drawing amount (X) of the continuous metal sheets estimated from the set locus of the outlets 16 of the reels 1 and 2, the momentary roll size of the metal sheet rolls and the position of the rolls. A rotation amount is determined by means of $[(X-\alpha)/4)]$ (wherein a being a correction amount for slight reduction), and the motors 7 and 9 are controlled according to this rotation amount. In this way, it is made possible to estimate the required amount of the metal sheets 3 and 4 in view of the transfer of the metal sheet rolls 5 and 6, to draw out the metal sheets 3 and 4 by a slightly reduced amount than estimated, and to prevent any excessive force of tension from occurring upon drawing of the metal sheets 3 and 4 so as to prevent them from being torn out. The control of FIG. 17 is executed at the respective steps n14, n16, n18, n20, n23 and n24 in FIG. 11. For the tension of the metal sheets, it is desirable that, when the thickness of the metal sheets is 18 µm, for example, the tension is set at a value of 10 g/cm to 1 kg/cm. This value of the tension is applicable to all working aspects described in the followings.

Figure 18:
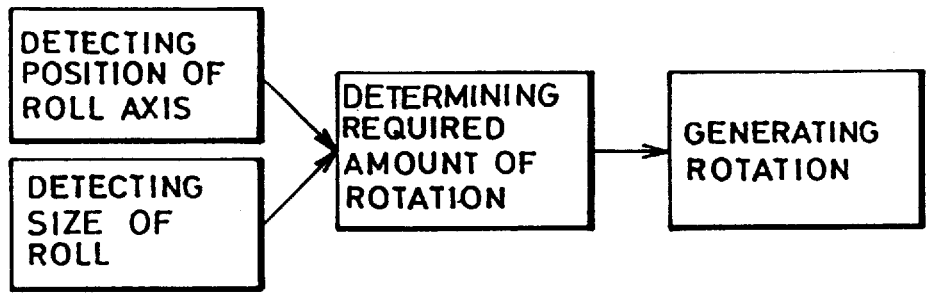
FIG. 18 is a block diagram for explaining another embodiment of the present invention.

FIG. 18 shows another embodiment in which means is provided for detecting the position of the reels 1 and 2 and the roll size of the metal sheet rolls 5 and 6, for controlling the rotation amount of the reels 1 and 2 according to the detection. The position of the reels 1 and 2 can be detected by means of, for example, an encoder 17 (FIG. 3) which measures rotary angle of the motors 7 and 8 for transferring the metal sheet rolls 5 and 6. When the roll size of the rolls 5 and 6 can be measured as shown in FIG. 15, the required drawing amount of the metal sheets 3 and 4 can be accurately calculated, and a required amount of the metal sheets 3 and 4 can be drawn out through determination of the required rotation amount of the reels 1 and 2 for the required drawing amount and generation of such required rotation amount. In this way, any slack of the metal sheets 3 and 4 or any application to them of the excessive force of tension can be prevented from occurring, so as to prevent the wrinkle, doubling or tear. The control of FIG. 18 is executed at the respective steps n14, n16, n18, n20, n23 and n24 in FIG. 11.

Figure 19A:
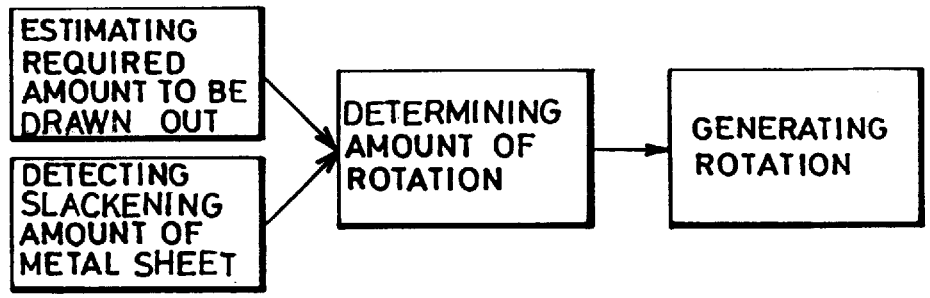
FIG. 19a is a block diagram for explaining another embodiment of the present invention.
Figure 19B:
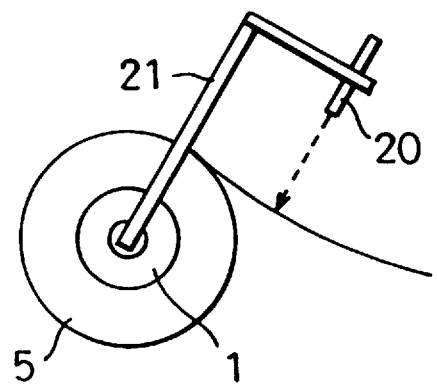
FIG. 19b shows the embodiment of FIG. 19a in a side view of part of the apparatus.

FIG. 19 shows another embodiment in which the gap sensor 20 is provided for detecting an amount of slack of the continuous metal sheets 3 and 4, for controlling the rotation amount of the reels 1 and 2 according to the detected slack amount. The required amount of the metal sheets 3 and 4 is estimated from the transferring path of the metal sheet rolls 5 and 6 (the locus of the outlets 16), the drawing amount of the metal sheets 3 and 4 determined to be slightly less than the estimated amount is rendered to be further slightly less, and the slack of the metal sheets 3 and 4 can be thereby restrained, so as to be able to prevent the wrinkle or doubling from occurring. It is assumed, for example, that a slack has occurred due to an excess estimation of the required drawing amount of the metal sheets, the estimated value (X) of the drawing amount is corrected to (X–β), and this value is further made to be [(X–β)–δ] to determine the rotation amount. By controlling in this manner the rotation amount of the reels 1 and 2 upon occurrence of the slack in the metal sheets, the wrinkle or slack of the metal sheets can be restrained. The control of FIG. 19 is executed at the steps n14, n16, n18, n20, n23 and n24 in FIG. 11.

Figure 20B:
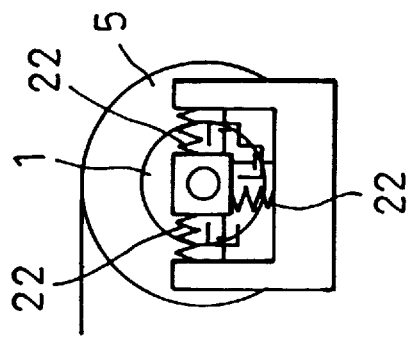
FIGS. 20a and 20b show another embodiment of the present invention in side and front views, respectively.

FIG. 20 shows another embodiment in which the shafts of the reels 1 and 2 are supported in three directions by means of springs 22 and dampers 23, which are to function as a shock absorber so that, when the shocking tensile force is about to be applied to the metal sheets 3 and 4, such shocking force can be absorbed to prevent the metal sheets from being torn out.

Figure 20A:
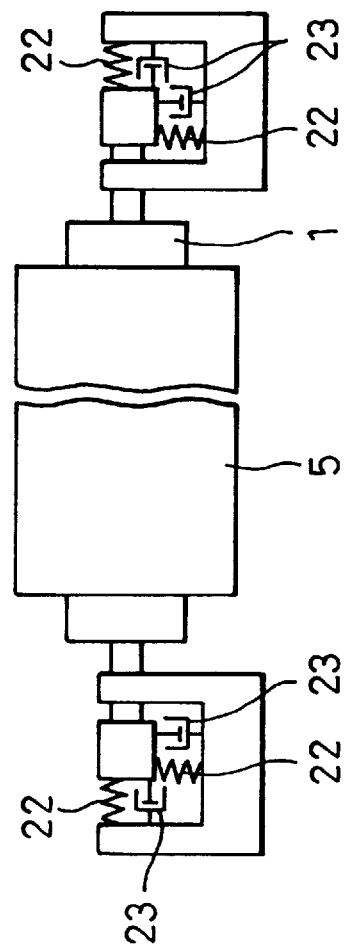

FIG. 21 shows another embodiment in which the angle and position of the reel 1 (likewise the reel 2) are adjusted so as to uniformly distribute the tensile force from the metal sheet 3 (or 4). While in this case the arrangement is so made that the interlayer 10 is placed to dispose its end edges to be in parallel to the axis of the reel 1 (or 2), there arises a risk that a deviated tensile force is applied to the metal sheets 3 (or 4) when the disposition is deviated as shown in FIG. 20a. However, when a mechanism for finely adjusting the shaft of the reel 1 (such mechanism as in FIG. 20, supporting the shaft with a bearing 24 incorporating the springs 22 and dampers 23) is provided, the attitude and position of the axis of the reel 1 are delicately varied according to the deviation of the tensile force, and a correction is so made as to apply the tensile force given to the metal sheet 3 (or 4) to the reel 1 uniformly in its axial direction (FIG. 21). In this manner, the tensile force can be made uniform as in FIG. 21c, and the metal sheets 3 and 4 can be prevented from being torn out.

At this time, it is desirable that the angle of the axis of the reel 1 is returned to the original upon termination of the transfer of the metal sheet roll 5 from one end edge to the other end edge of the laminate block 12. That is, when the attitude and position of the reel 1 are left as varied as shown in FIG. 22a, the deviation in the metal sheet 3 should be gradually enlarged, even if the next interlayer 10 would be placed to dispose its end edges to be parallel to the axis of the reel 1. Further, upon termination of the transfer of the roll 5 to be standstill, that tensile force which has been applied during the transfer ceases. Therefore, in the event where the mechanism of FIG. 20 is employed, the axis of the reel 1 being born by bearings 24 incorporating the springs 22 and dampers 23, the attitude and position of the reel axis are to be returned to the original by resetting action of the springs 22 as in FIG. 22b so that, even in the case when the next interlayer 10 is placed to dispose their end edges to be parallel to the reel axis, the deviation of the metal sheet restrained to be further enlarged, and the deviation in the metal sheet 3 or 4 can be thus corrected.

Further, the correction of the deviation in the metal sheets is made possible in the same manner as in the above, even when the gap sensors 20 for detecting the slack in the metal sheets 3 and 4 at both side edges as well as a mechanism which can apply to the axis of the reel 1 an action in each of three directions by means of hydraulic cylinders are provided.

Figure 24:
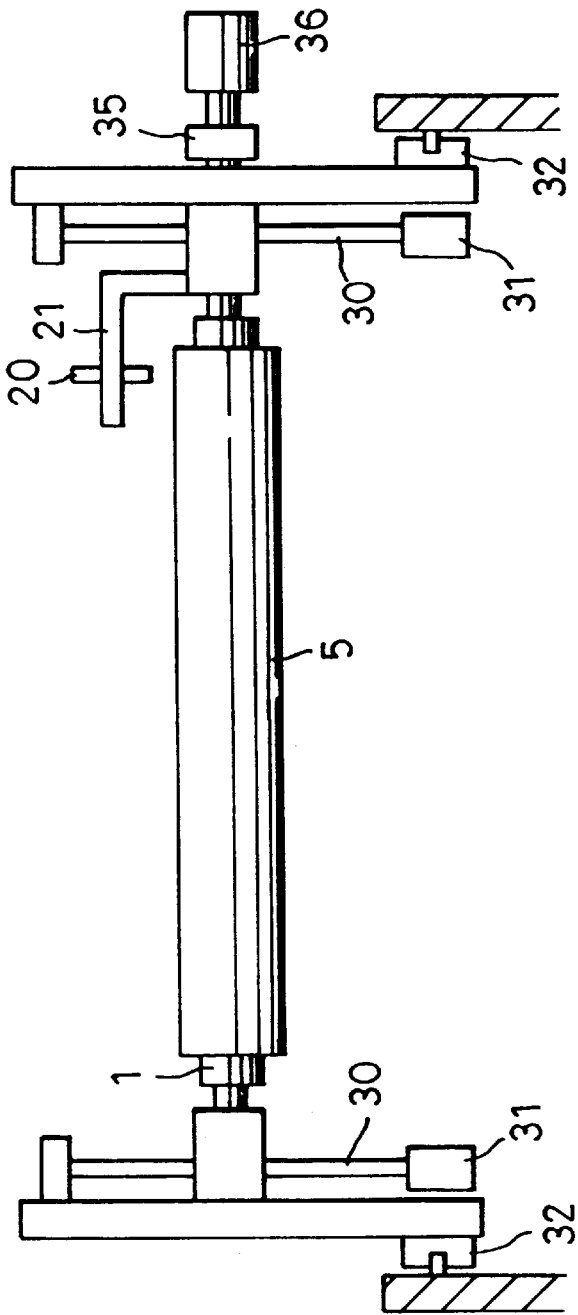
FIG. 24 is a side view of part of the apparatus in another embodiment of the present invention.

FIG. 24 shows an arrangement including a reel shaft rotating motor 36 for generating a torque on the shaft of the reel 1, a torque sensor 35 for detecting the torque generated on the reel shaft, and the gap sensor 20 for detecting such roll size as radius or diameter of the metal sheet roll 5, so that the tensile force applied to the metal sheet 3 is calculated in view of the torque and roll size detected, and the tensile to the metal sheet 3 is controlled to be constant with the torque generated on the reel shaft. As also shown in FIG. 24, threaded poles 30 are provided with respect to the reel 1, and transferring guides 32 are provided on both sides. Motors 31 are coupled to the threaded poles 30 for providing to the shaft of the reel 1 a rotating drive, so that a torque will be given in a direction of assisting the drawing of the metal sheet, and the tensile force applied to the metal sheet upon drawing can be reduced, and the metal sheet can be prevented from being torn out.

Figure 25:
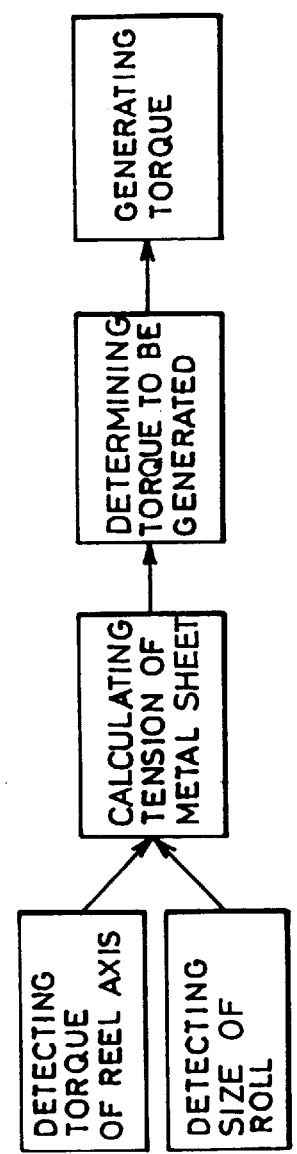
FIG. 25 is a block diagram showing another embodiment of the present invention.

FIG. 25 shows an arrangement for controlling the tensile force during the transfer of the metal sheets rolls 5 and 6, which control is executed at the steps n14, n16, n18, n20, n23 and n24 in FIG. 11. Similar to the arrangement of FIG. 24, the gap sensor 20 is at a fixed position with respect to the reel shaft, and the roll size is obtained from the sensed value of the gap sensor 20 and positional data of the sensor. The tensile force is calculated for a tensile force applied to the metal sheet (T=τ/r), wherein r is a radius of the roll, and τ is a detected torque. In determining the generated torque, the motors 31 are controlled to render any difference between a predetermined value and a calculated value to be zero, and the torque will be of a constant value. Therefore, the metal sheet can be prevented from being subjected to any excessive tensile force, and from being torn out, slackened and wrinkled.

As another working aspect, the arrangement may be so made that a resistance to a rotation over a certain magnitude is provided to the shafts of the reels 1 and 2. In this case, a resistance of a level not allowing the reels 1 and 2 to be rotated by the inertial force of rotation upon termination of the rotation of the reels 1 and 2 caused by the drawing of the metal sheets 3 and 4, for example, is given to the reel shafts, so that the metal sheets 3 and 4 can be prevented from being excessively drawn out of the rolls, and consequently the inertial rotation of the reels 1 and 2 can be prevented from occurring, to be able to prevent the wrinkle or the like from occurring in the metal sheets 3 and 4 due to their slack.

Figure 26:
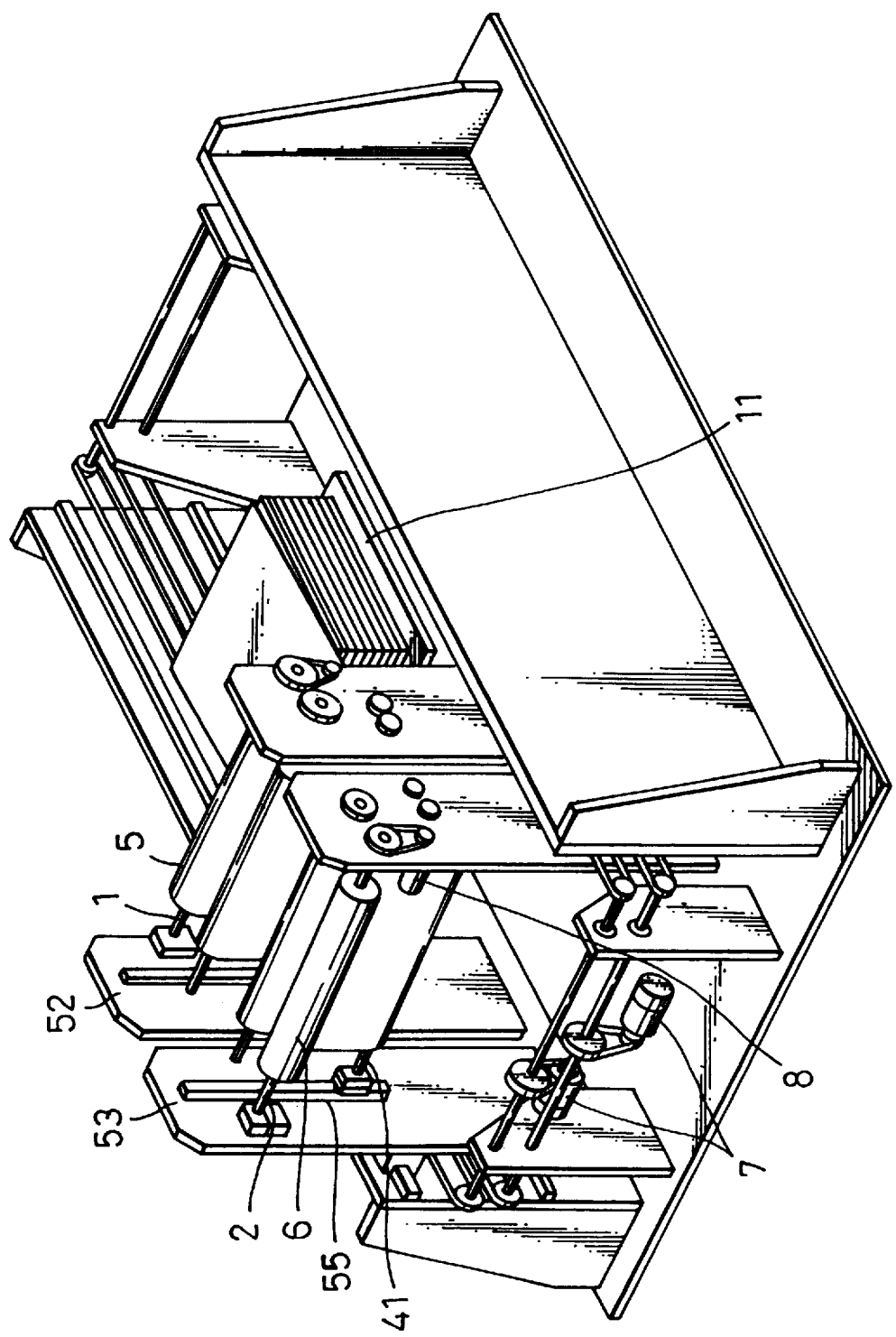
FIG. 26 is a perspective view of the laminate manufacturing apparatus in another embodiment of the present invention.

FIGS. 26 through 33 show another embodiment of the laminate manufacturing apparatus, in which, as shown in FIG. 26, first and second stepped rollers 40 and 41 vertically shiftable are provided in correspondence to the first and second continuous metal sheet rolls 5 and 6 for stretching the first and second continuous metal sheets 3 and 4, first and second transfer bases 52 and 53 are provided for bearing the first and second rolls 5 and 6 as well as the first and second stepped rollers 40 and 41, and first and second motors 7 are provided for horizontally transferring the transfer bases 52 and 53. Except for these respects, the apparatus is constituted in the same manner as that of FIG. 3. Further, as shown in FIG. 26, other reel rotating motors 8 are disposed.

At the respective transfer bases 52 and 53, the stepped rollers 40 and 41 are disposed between the continuous metal sheet rolls 5 and 6 and respective feed rollers, to be slidable along vertical guides 55 and 56. Further, as shown in FIG. 27, supplemental bars 70 are provided.

Figure 29A:
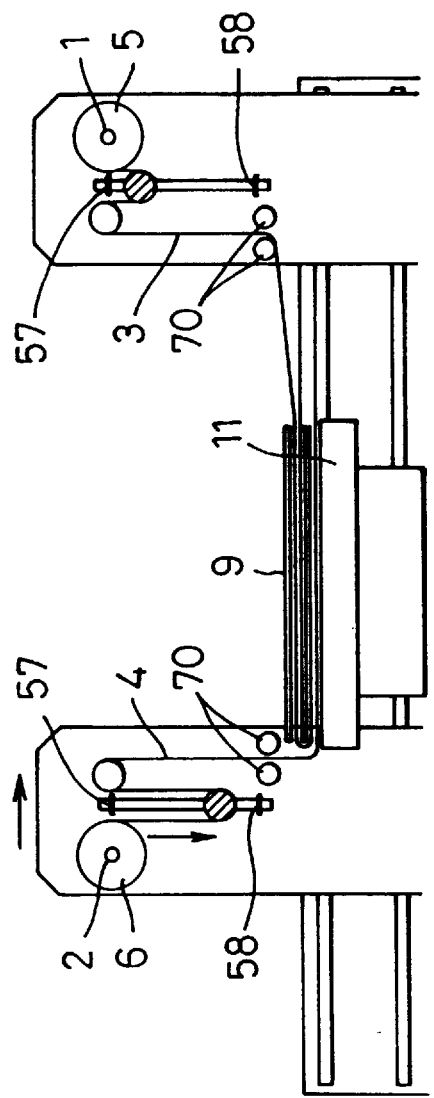
FIGS. 29a and 29b are explanatory views for the stacking step in the embodiment of FIG. 26.
Figure 29B:
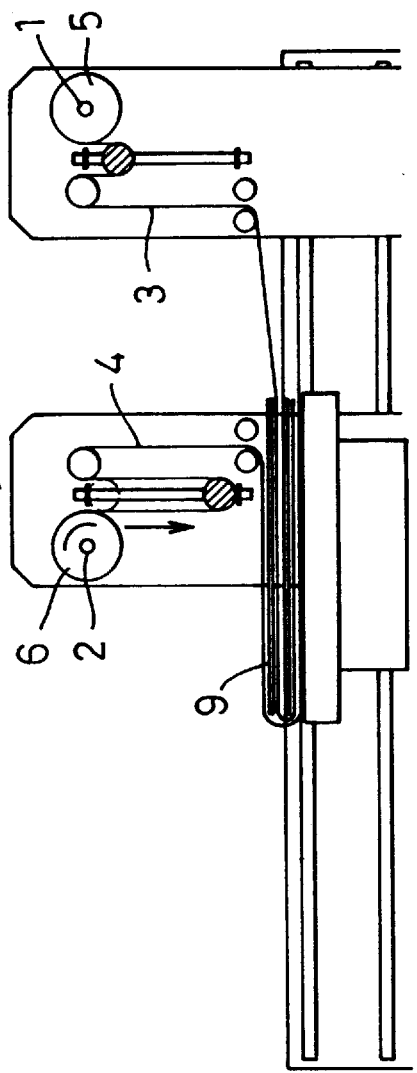
Figure 30A:
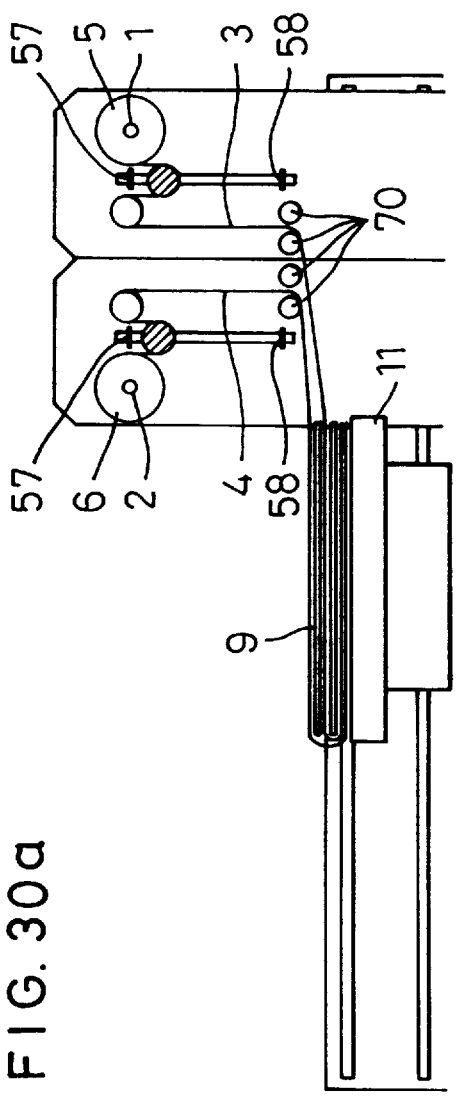
FIGS. 30a and 30b are explanatory views for the stacking step in the embodiment of FIG. 26.
Figure 30B:
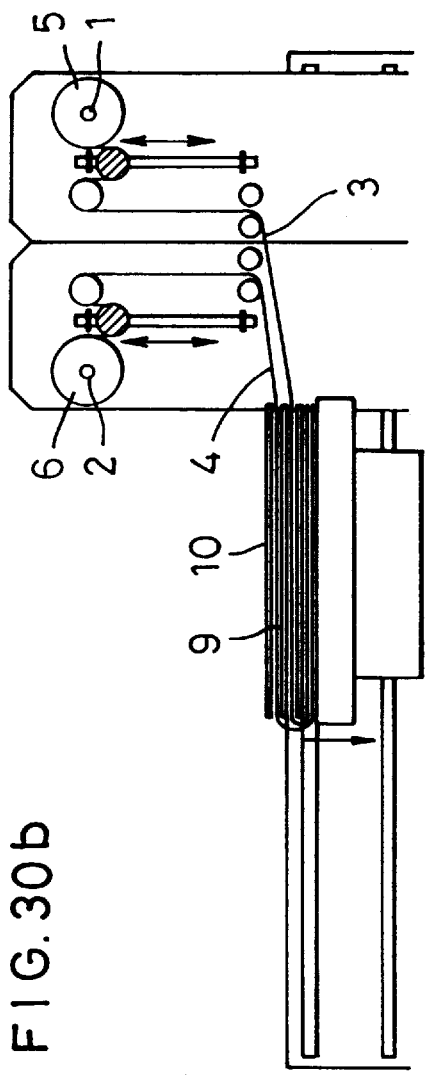

An example of manufacturing steps employing this apparatus shall be described with reference to FIGS. 27–33. First, the two continuous metal sheets 3 and 4 are set on the working table 11, and one interlayer 10 is placed thereon, as in FIG. 27*a*. Then, the first transfer base 52 is transferred to shift the roll 5 of the metal sheet 3 wound on the reel 1 so as to pass over the table 11, upon which the first stepped roller 40 starts shifting down along the guide 55 as a closer end edge of the table 11 approaches, the stepped roller 40 being lowered by the amount in which the metal sheet 3 is excessively drawn out, and the metal sheet 3 can be maintained in tension at all times (FIGS. 27*b* and 28*a*). As the roll 5 passes over a farther end edge of the table 11, the stepped roller 40 turns to shift upward along the guide 55 and, as the top limit of the guide 55 is reached, the stepped roller 40 touches a limit switch 57, to have the upward shift to the top limit detected thereby. At this time, the reel rotating motor 8 is driven to have the metal sheet 3 drawn out until the stepped roller 40 reaches the lower limit, the limit switch 58 disposed at which detects that the lower limit is reached by the roller 40. As the transfer continues to have the farther end edge passed over by the roll 5, the base 52 is stopped at a predetermined position. Here, one synthetic resin sheet members 9 such as the prepreg is placed on the metal sheet 3 which now covering the interlayer 10, and the working table 11 is lowered by the thickness of the metal sheet 3 and prepreg 9 to match the working level to the initial state of FIG. 27*a* (FIG. 28*b*). Then the second transfer base 53 is transferred, so that the roll 6 of the continuous metal sheet 4 wound on the reel 2 will be transferred to pass over the first part of the laminate block 12 on the table 11. As the roll 6 approaches the closer end edge of the block 12, the second stepped roller 41 shifts downward along the guide 56, so that the metal sheet 4 can be kept in tension at all times (FIG. 29*a*). As the closer end edge is passed, the stepped roller 41 starts shifting upward until the upper limit is reached, and this is detected by the limit switch 57. Here, the reel rotating motor 8 is driven, to have the metal sheet 4 drawn out until the stepped roller 41 reaches the lower limit, which is detected by another limit switch 58 (FIG. 29*b*). Thereafter, the transfer continues to render the base 53 and roll 6 to pass over the farther end edge of the laminate block 12 and to stop at a predetermined position (FIG. 30*a*). Then, another interlayer 10 is placed on the metal sheet 4 as shown in FIG. 30*b*. Thereafter, the similar work is continued in reverse direction as in FIGS. 31–33, and two sets of the laminates are enabled to be formed. With such work performed repeatedly, the laminate block 12 is formed with the laminates stacked in multiple layers. Throughout the series of work as in the above, the work can be executed in a state where the continuous metal sheets 3 and 4 are kept in tension by the action of the stepped rollers 40 and 41, and the metal sheets 3 and 4 can be prevented from being wrinkled or doubled.

Figure 34:
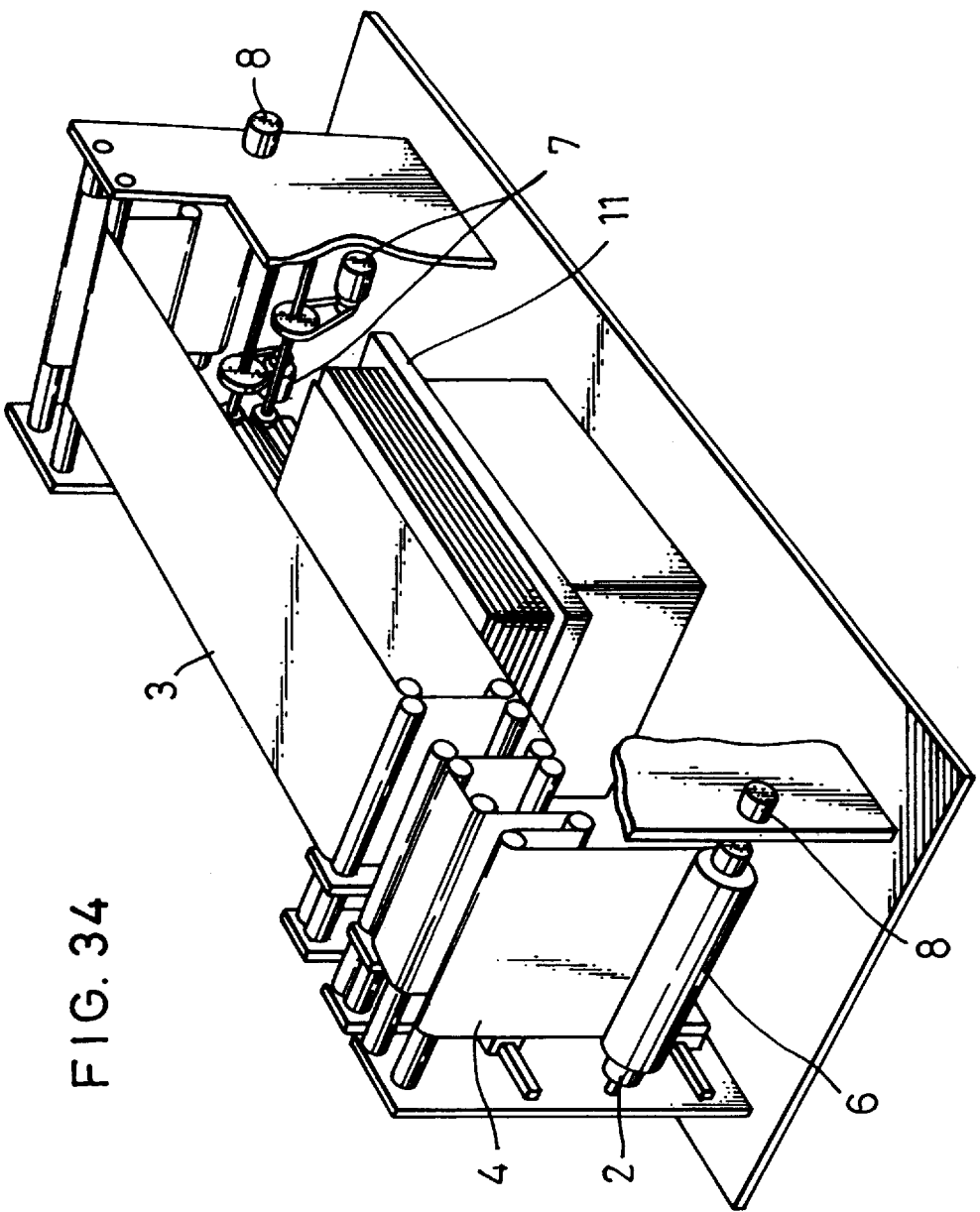
FIG. 34 is a perspective view of the laminate manufacturing apparatus in still another embodiment of the present invention.

FIGS. 34–41 show another embodiment of the laminate manufacturing apparatus of the present invention, in which first and second stepped rollers 50 and 51 vertically shiftable are provided in correspondence to the first and second continuous metal sheet rolls 5 and 6 for stretching the first and second continuous metal sheets 3 and 4, while the first and second transfer bases 62 and 63 for supplying the first and second continuous metal sheets 3 and 4 through the horizontal transfer as well as the first and second motors 7 for the horizontal transfer are provided. Except these respects, the apparatus is constituted in the same manner as in the case of FIG. 3. As shown in FIGS. 34 and 35, there are provided the reel rotating motor 8, vertical shifting guides 55 and 56 and supplementary bars 70 and 71.

Figure 36A:
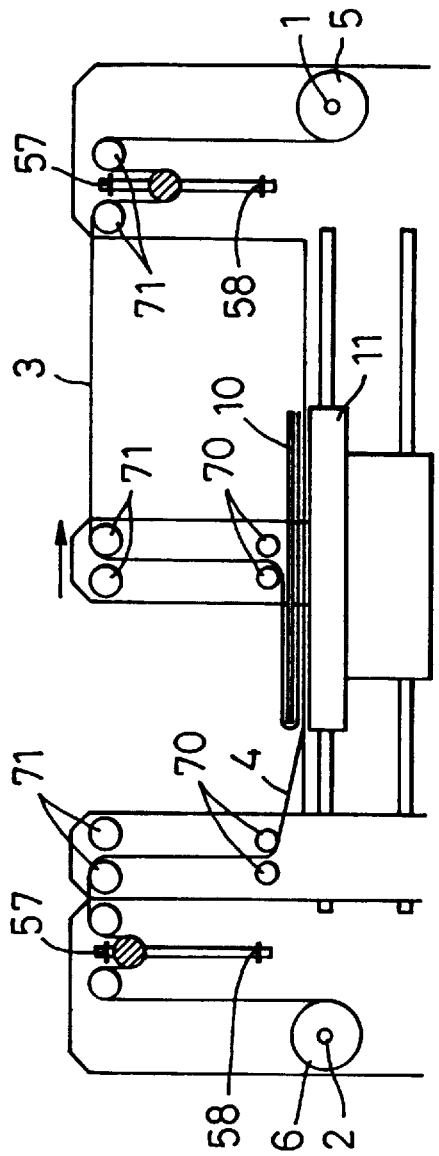
FIGS. 36a and 36b are explanatory views for the stacking step in the embodiment of FIG. 34.
Figure 36B:
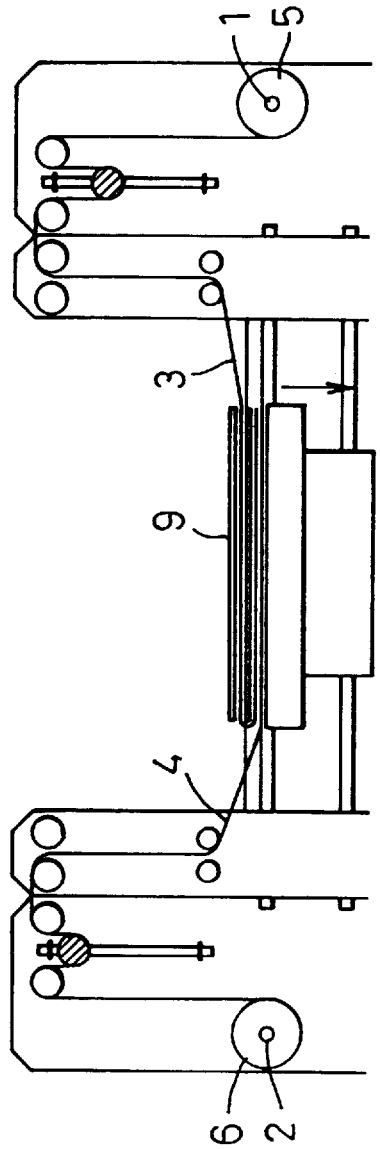
Figures 41A, 41B:
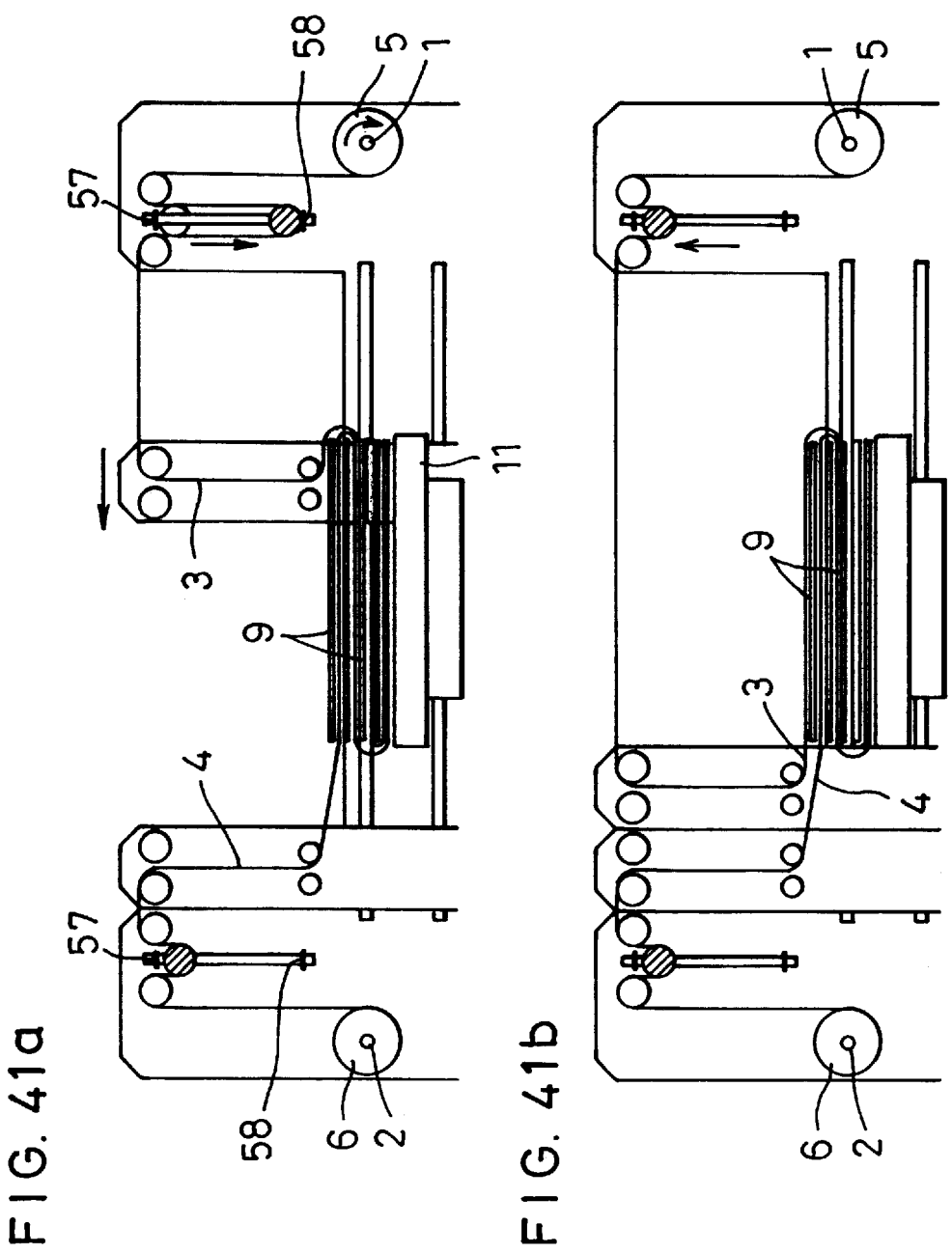
FIGS. 41a and 41b are explanatory views for the stacking step in the embodiment of FIG. 34.

An example of the manufacturing steps shall be described with reference to FIGS. 35–41. First, as in FIG. 35*a*, the two continuous metal sheets 3 and 4 are set on the working table 11, and first one of the interlayer 10 is placed thereon. Then the first transfer base 62 carrying the metal sheet 3 through the supplementary bars 70 and 71 is transferred to stack the metal sheet 3 on the interlayer 10 to enclose it. At this time, as the transfer base 62 approaches the closer end edge of the table 11, the first stepped roller 50 shifts downward along the guide 55 so that the metal sheet 3 can be kept in tension at all times (FIG. 35*b*). Thereafter, the transfer of the base 62 continues (FIG. 36*a*) to render it to pass through the farther end edge of the table 11, and the base 62 is stopped at a predetermined position (FIG. 36*b*). Here, in the first synthetic resin sheet member 9 such as the prepreg is placed on the metal sheet 3 which covering the interlayer 10, the working table 11 is lowered by the thickness of the metal sheet 3 and prepreg 9, and the working level is matched to the initial state of FIG. 35*a*. Then the transfer base 63 is moved to stack the metal sheet 4 so as to cover the prepreg 9 (FIG. 36*a*). As the base 63 passes through the position of the closer end edge of the laminate block 12 on the table 11, the second stepped roller 51 starts moving upward along the guide 56. The limit switch 57 detects that the upper limit is reached by the roller 51, upon which the reel rotating motor 8 is driven to have the metal sheet 4 drawn out until the roller 51 reaches the lower limit, which moment is detected by the limit switch 58 (FIG. 37*b*). The transfer base 63 continues to transfer and, as the base pass through the farther end edge of the laminate block 12, the base 63 stops the transfer at a predetermined position (FIG. 38*a*). Then another interlayer 10 is stacked on the metal sheet 4 (FIG. 38*b*). Thereafter, the same work is repeated in reverse direction as shown in FIGS. 39–41, and two sets of the laminate can be formed. Executing the work repeatedly, the laminate block 12 is formed with a plurality of the laminates stacked in multiple stages. Throughout this series of steps, the stacking work can be performed with the continuous metal sheets 3 and 4 kept in tension by the action of the first and second stepped rollers 50 and 51, whereby the metal sheets 3 and 4 can be prevented from being wrinkled or doubled.

While in the respective foregoing embodiments the timing of executing the electric heating of the continuous metal sheets 3 and 4 within the laminate block 12 as well as the timing of the pressing of the block by means of the molding press 15 may be so set as to first start the electric heating and thereafter to perform the press, the arrangement may be so made as to perform reversely the electric heating in the state where the block is being pressed. It is also desirable to carry out the electric heating and the pressing simultaneously.

What is claimed is:

1. An apparatus for manufacturing laminates, characterized in comprising a laminate block forming device including two rolls of continuous metal sheets would respectively on each of two reels, driving power sources for transferring the continuous metal sheet rolls respectively in vertical directions and in horizontal directions while keeping the continuous metal sheets in tension, and a working table for forming thereon a laminate block; an electric power source for electrically heating the two continuous metal sheets in the laminate block; and a molding press for pressing the laminate block in a state of being electrically heated.

2. The apparatus according to claim 1, characterized in that the laminate block forming device further includes a brake unit for stopping the rotation of the reels.

3. The apparatus according to claim 1, characterized in that the reels are provided with a driving power source for rotating shafts of the reels.

4. The apparatus according to claim 1, characterized in that the reels are provided with a rotary driving source for providing to shafts of the reels a torque for winding up the continuous metal sheets.

5. The apparatus according to claim 1, characterized in that the working table on which the laminates are stacked in multiple stages is provided with a mechanism for vertically moving the table.

6. An apparatus for manufacturing laminates, characterized in comprising a laminate block forming device including two rolls of continuous metal sheets wound respectively on each of two reels, two stepped rollers provided in correspondence to the rolls to be vertically shiftable for stretching the metal sheets, two transfer bases bearing the rolls and stepped rollers, a driving power source for horizontally moving the two transfer bases, and a working table for placing thereon a laminate block; an electric power source for electrically heating the two continuous metal sheets in the laminate block; and a molding press for pressing the laminate block in a state of electrically heating the laminate block.

7. The apparatus according to claim 6, characterized in that the laminate block forming device further includes a brake unit for stopping the rotation of the reels.

8. The apparatus according to claim 6, characterized in that the reels are provided with a driving power source for rotating shafts of the reels.

9. The apparatus according to claim 6, characterized in that the reels are provided with a rotary driving source for providing to shafts of the reels a torque for winding up the continuous metal sheets.

10. The apparatus according to claim 6, characterized in that the working table on which the laminates are stacked in multiple stages is provided with a mechanism for vertically moving the table.

11. An apparatus for manufacturing laminates, characterized in comprising a laminate block forming device including two rolls of continuous metal sheets wound respectively on each of two reels, two stepped rollers provided in correspondence to the rolls to be vertically shiftable for stretching the metal sheets, two transfer bases horizontally movable for supplying the two metal sheets, a driving power source for horizontally moving the two transfer bases, and a working table for placing thereon a laminate block and disposed between the two continuous metal sheet rolls; an electric power source for electrically heating the two metal sheets in the laminate block; and a molding press for pressing the laminate block in a state of electrically heating the laminate block.

12. The apparatus according to claim 11, characterized in that the laminate block forming device further includes a brake unit for stopping the rotation of the reels.

13. The apparatus according to claim 11, characterized in that the reels are provided with a driving power source for rotating shafts of the reels.

14. The apparatus according to claim 11, characterized in that the reels are provided with a rotary driving source for providing to shafts of the reels a torque for winding up the continuous metal sheets.

15. The apparatus according to claim 11, characterized in that the working table on which the laminates are stacked in multiple stages is provided with a mechanism for vertically moving the table.

* * * * *